(12) United States Patent
Tanaka

(10) Patent No.: US 8,950,216 B2
(45) Date of Patent: Feb. 10, 2015

(54) METHOD FOR MANUFACTURING GLASS SEALED BODY AND METHOD FOR MANUFACTURING LIGHT-EMITTING DEVICE

(75) Inventor: Koichiro Tanaka, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 358 days.

(21) Appl. No.: 13/468,607

(22) Filed: May 10, 2012

(65) Prior Publication Data

US 2012/0285200 A1     Nov. 15, 2012

(30) Foreign Application Priority Data

May 13, 2011 (JP) ................................. 2011-107804

(51) Int. Cl.
| | | |
|---|---|---|
| C03B 23/207 | (2006.01) | |
| C03B 23/24 | (2006.01) | |
| C03C 27/06 | (2006.01) | |
| H01L 51/52 | (2006.01) | |
| H01J 9/24 | (2006.01) | |

(52) U.S. Cl.
CPC ............ C03C 27/06 (2013.01); H01L 51/5246 (2013.01); H01J 9/248 (2013.01)
USPC ...................... 65/36; 65/43; 156/99

(58) Field of Classification Search
CPC ...... C03B 23/245; C03B 15/10; C03B 23/20; C03B 23/24; C03B 23/203; C03B 23/204; C03B 23/207; C03B 23/22; C04B 2237/10; C04B 2237/341; C04B 2237/348; C04B 2237/406; C04B 2237/62; C04B 2237/78; C04B 2237/84; C04B 2237/062; C04B 2237/09; C04B 2237/122; C04B 2237/125

USPC .......................................... 65/42–43; 156/99
See application file for complete search history.

(56) References Cited

U.S. PATENT DOCUMENTS

| | | | | |
|---|---|---|---|---|
| 3,118,540 | A * | 1/1964 | Brutsch et al. | 72/43 |
| 4,676,817 | A * | 6/1987 | Tailor et al. | 65/43 |
| 5,725,670 | A * | 3/1998 | Wilson et al. | 118/629 |
| 6,113,450 | A | 9/2000 | Narayanan et al. | |
| 6,216,589 | B1 * | 4/2001 | Tani | 101/123 |
| 6,482,468 | B1 * | 11/2002 | Haas | 427/202 |
| 6,646,284 | B2 | 11/2003 | Yamazaki et al. | |
| 6,725,769 | B1 * | 4/2004 | Williams | 101/123 |
| 6,803,246 | B2 | 10/2004 | Yamazaki et al. | |
| 6,860,780 | B2 | 3/2005 | Miyashita et al. | |
| 6,984,159 | B1 | 1/2006 | Kado et al. | |
| 6,998,776 | B2 | 2/2006 | Aitken et al. | |

(Continued)

FOREIGN PATENT DOCUMENTS

JP          2011-65895        3/2011

*Primary Examiner* — Jodi C Franklin
(74) *Attorney, Agent, or Firm* — Husch Blackwell LLP

(57) ABSTRACT

In a method for manufacturing a glass sealed body, a paste including powdered glass and a binder is discharged from an outlet whose shape is a closed curve to form a partition whose shape is a closed curve over a first glass substrate; the partition is heated so that the binder is volatilized and the powdered glass is fused to be a frit glass; and the frit glass and a second glass substrate are heated while disposing in close contact with each other, so that the frit glass and the second glass substrate are welded together to form a closed space by the frit glass, the first glass substrate, and the second glass substrate. A light-emitting element is sealed with the glass sealed body, so that the sealing is hardly broken even when impact or external force is applied.

20 Claims, 17 Drawing Sheets

(56) References Cited

U.S. PATENT DOCUMENTS

| | | |
|---|---|---|
| 7,121,642 B2 | 10/2006 | Stoessel et al. |
| 7,407,423 B2 | 8/2008 | Aitken et al. |
| 7,431,628 B2 | 10/2008 | Park et al. |
| 7,602,121 B2 | 10/2009 | Aitken et al. |
| 7,701,136 B2 | 4/2010 | Kwak |
| 7,780,493 B2 | 8/2010 | Choi et al. |
| 7,837,530 B2 | 11/2010 | Park |
| 7,868,540 B2 | 1/2011 | Kim |
| 7,871,949 B2 | 1/2011 | Lee et al. |
| 7,944,143 B2 * | 5/2011 | Choi et al. ............ 313/512 |
| 8,063,560 B2 | 11/2011 | Aitken et al. |
| 8,125,146 B2 | 2/2012 | Park |
| 8,164,257 B2 | 4/2012 | Choi et al. |
| 2003/0026899 A1 * | 2/2003 | Morita et al. ........... 427/240 |
| 2003/0094519 A1 * | 5/2003 | van der Steur ........... 239/690 |
| 2006/0073082 A1 * | 4/2006 | Ducree et al. ........... 422/103 |
| 2006/0226762 A1 * | 10/2006 | Sasamoto et al. ......... 313/495 |
| 2007/0002257 A1 * | 1/2007 | Oh et al. ............... 349/153 |
| 2007/0170860 A1 * | 7/2007 | Choi et al. ............. 313/512 |
| 2008/0124558 A1 * | 5/2008 | Boek et al. ............. 428/427 |
| 2009/0260242 A1 * | 10/2009 | Ruether et al. .......... 33/366.21 |
| 2009/0308105 A1 * | 12/2009 | Pastel et al. ........... 65/42 |
| 2011/0014427 A1 * | 1/2011 | Burgess et al. .......... 428/149 |
| 2011/0073880 A1 * | 3/2011 | Lee et al. .............. 257/88 |
| 2011/0091668 A1 * | 4/2011 | Lamberson et al. ....... 428/34 |
| 2011/0135857 A1 * | 6/2011 | Logunov et al. ......... 428/34.6 |
| 2011/0236578 A1 * | 9/2011 | Matsui et al. .......... 427/256 |
| 2011/0256407 A1 * | 10/2011 | Boek et al. ............ 428/428 |
| 2011/0259858 A1 * | 10/2011 | Wappler et al. ......... 219/121.64 |
| 2012/0164750 A1 * | 6/2012 | Gjerde et al. .......... 436/178 |
| 2013/0239622 A1 * | 9/2013 | Haase Pastel et al. ... 65/155 |
| 2013/0305785 A1 * | 11/2013 | Dennis et al. .......... 65/34 |
| 2013/0306222 A1 * | 11/2013 | Dennis et al. .......... 156/109 |
| 2013/0309425 A1 * | 11/2013 | Dennis et al. .......... 428/34 |

* cited by examiner

FIG. 14A
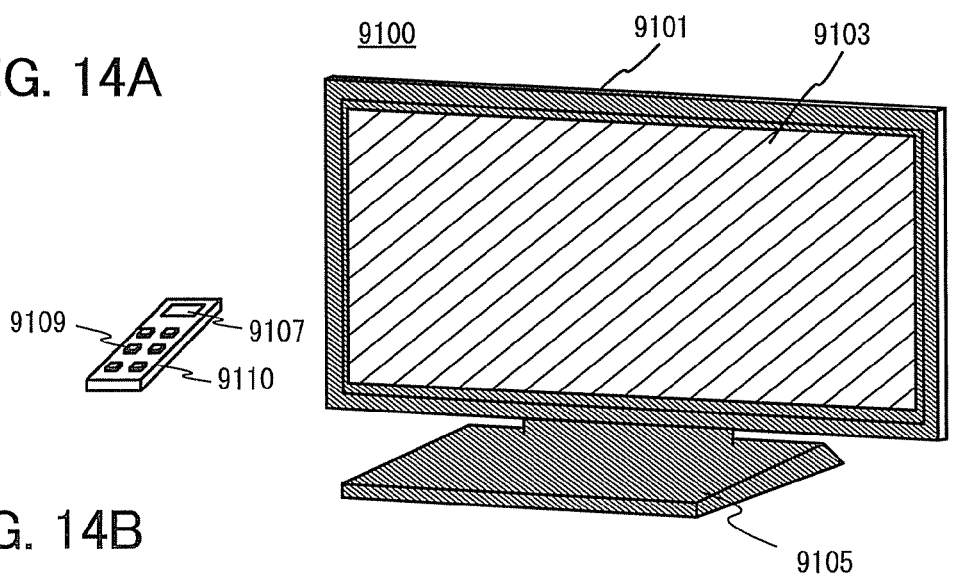
FIG. 14B
FIG. 14C
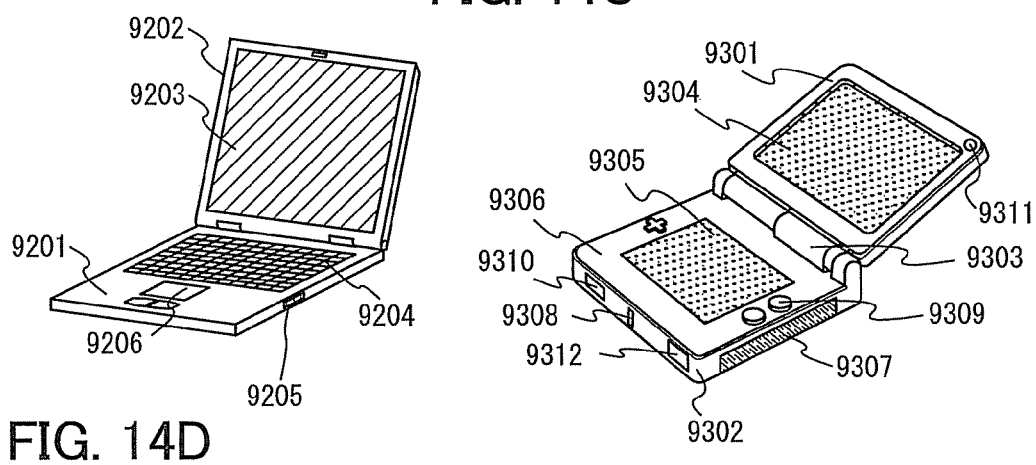
FIG. 14D
FIG. 14E
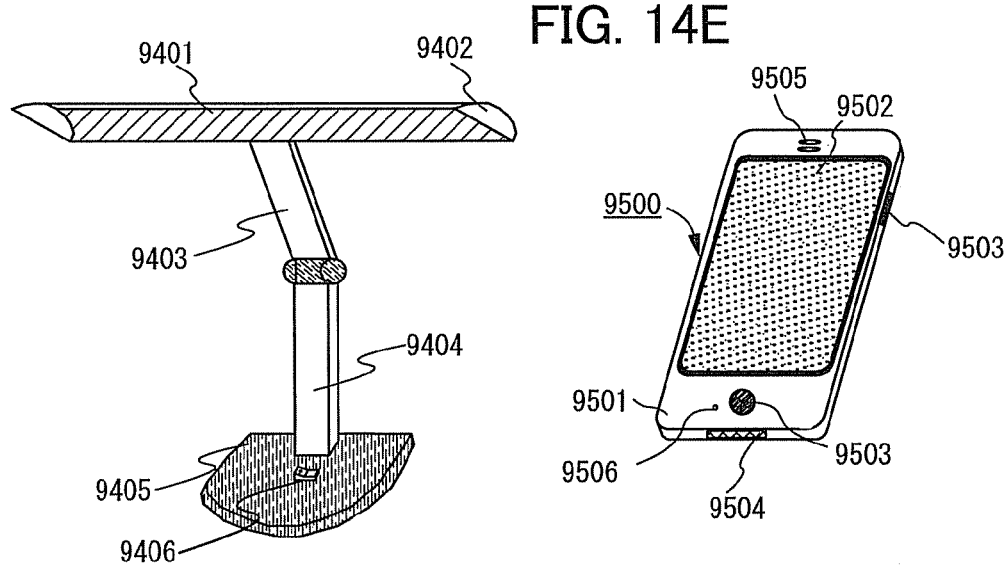

METHOD FOR MANUFACTURING GLASS SEALED BODY AND METHOD FOR MANUFACTURING LIGHT-EMITTING DEVICE

BACKGROUND OF THE INVENTION

1. Field of the Invention

The present invention relates to a method for manufacturing a sealed body by which a device is protected against the air. One embodiment of the disclosed invention relates to a method for manufacturing a glass sealed body and a method for manufacturing a light-emitting device provided with the glass sealed body.

Note that in this specification, the light-emitting device refers to a display device such as an organic EL display device or a light source (a lighting device) such as lighting or a sign (e.g., a traffic light or a warning light). Further, the device includes a light-emitting element.

2. Description of the Related Art

In recent years, light-emitting devices which have electroluminescence (hereinafter, referred to as EL) elements using EL as self-luminous light-emitting elements have been actively researched. The light-emitting devices are used for organic EL display devices, organic EL lighting devices, and the like. Such light-emitting devices are also called organic light-emitting diodes. The light-emitting devices provided with EL elements have features suitable for display of moving images, such as high response speed and low-voltage, low-power consumption driving, and thus they have attracting great attention as next-generation display devices such as new-generation mobile phones or personal digital assistants (PDA).

For a light-emitting device in which. EL elements are arranged in a matrix, a driving method such as passive (simple) matrix driving or active matrix driving can be used. However, when the pixel density is increased, the active matrix type where each pixel (or each dot) is provided with a switch is considered to be advantageous because it can be driven at a lower voltage.

An organic EL element which is one of EL elements has a structure typified by a stacked structure of a hole-transport layer, a light-emitting layer, and an electron-transport layer. Materials for these layers are roughly classified into low molecular (monomer) materials and high molecular (polymer) materials, and thin film formation of the low molecular materials is carried out by an evaporation method, for example.

A hole-transport layer, a light-emitting layer, an electron-transport layer, or the like are layers involved in light emission and are interposed between an anode and a cathode. The layers involved in light emission which have a stacked structure between the anode and the cathode are collectively referred to as an organic EL layer in this specification. As luminescence from an organic EL element, light emission (fluorescence) which is generated in returning from a singlet excited state to the ground state, and light emission (phosphorescence) which is generated in returning from a triplet excited state to the ground state are known.

Unlike a liquid crystal display device which needs a backlight, an organic EL display device having organic EL elements is a self-luminous device and thus it has excellent visibility due to its capability of easily realizing high contrast and its wide viewing angle. That is, the organic EL display device is more suitable for a display device for outdoor use than a liquid crystal display device. A variety of applications of the organic EL display device, such as a display device of a mobile phone or a digital camera, and the like, have been proposed.

Further, with the use of an organic EL element, a planar light-emitting device having a large area can be easily formed. This is a feature which is difficult to be obtained in point light sources typified by incandescent lamps and LEDs or line light sources typified by fluorescent lamps. In addition, the organic EL element is estimated to have higher emission efficiency than incandescent lamps or fluorescent lamps. Therefore, the light-emitting element has attracted attention as a preferable next-generation lighting device.

The organic EL element has a disadvantage that when an organic EL layer and electrodes between which the organic EL layer is interposed are exposed to moisture or oxygen, the performance might be rapidly lowered. In this regard, as a technique for preventing exposure of the organic EL layer or both the electrodes to the air, for example, conventional technique described in Patent Document 1 is known. In the technique described in Patent Document 1, paste-like powdered glass is scanned along an edge of a glass substrate while being discharged from a nozzle, whereby a partition whose shape is a closed curve is formed of the powdered glass. After that, baking is performed so that the powdered glass is fused to be a frit glass. Further, the partition is pressed against the other glass substrate, and the partition and the other glass substrate are welded together by laser welding; thus, a highly airtight glass sealed body is formed. By protecting an organic EL element by the glass sealed body, deterioration of the organic EL element can be suppressed. When part or all of the glass sealed body has a property of transmitting visible light rays, even when a light-emitting element is provided in the glass sealed body, light can be extracted to the outside.

REFERENCE

[Patent Document 1] Japanese Published Patent Application No. 2011-65895

SUMMARY OF THE INVENTION

The technique that a frit glass is used as a partition and an organic EL element is sealed with two glass substrates has remarkably higher airtightness as compared to the case where glass substrates are bonded to each other with a sealant, and has a great advantage in that which a desiccant is not required. Since a desiccant is not required, a problem in that part of light is shielded by the desiccant does not occur even when a top emission structure is employed. However, since the paste-like powdered glass is discharged from the nozzle to draw a closed curve to form in the partition, there is a high possibility that continuity of the paste-like powdered glass is broken at a portion where the closed curve is closed and thereby sealing of the portion becomes insufficient. Further, even when slight impact or external force is applied to the glass sealed body manufactured in this manner, there is a possibility that the sealing is broken from the applied portion.

In view of the above-described problems, an object of one embodiment of the present invention is to provide a method for manufacturing a glass sealed body in which the sealing is not easy broken. Further, an object of one embodiment of the present invention is to provide a method for manufacturing a light-emitting device provided with the glass sealed body.

One embodiment of the present invention is a method for manufacturing a glass sealed body, comprising the steps of discharging a paste including powdered glass and a binder from an outlet whose shape is a closed curve (an annular shape) to form a partition whose shape is a closed curve (an annular shape) of the paste over a first glass substrate; heating the partition so that the binder is volatilized and the powdered glass is fused to be a frit glass; and heating the frit glass and a second glass substrate while disposing in close contact with each other, so that the frit glass and the second glass substrate are welded together to form a closed space by the fit glass, the first glass substrate, and the second glass substrate.

One embodiment of the present invention is a method for manufacturing a light-emitting device, comprising the steps of discharging a paste including powdered glass and a binder from an outlet whose shape is a closed curve (an annular shape) to form a partition whose shape is a closed curve (an annular shape) of the paste over a first glass substrate; heating the partition so that the binder is volatilized and the powdered glass is fused to be a frit glass; forming a light-emitting element over a second glass substrate; and heating the frit glass rapidly while the frit glass and the second glass substrate are disposed in close contact with each other, so that the frit glass and the second glass substrate are welded together to form a closed space by the frit glass, the first glass substrate, and the second glass substrate to seal the light-emitting element in the closed space.

Part of a terminal of an electrode, which is led from the light-emitting element, may be interposed between the frit glass and the second glass substrate. At this time, a depressed portion may be in advance formed in the fit glass and may be engaged with the part of the terminal, whereby the airtightness of the closed space can be increased. For example, the depressed portion can be formed by pressing a mold having a desired shape against the partition after coating of the paste. After that, heating is performed and thus the paste is cured, whereby the frit glass including the depressed portion can be obtained.

Further, one embodiment of the present invention is a method for manufacturing a light-emitting device, comprising the steps of forming a light-emitting element over a first glass substrate; discharging a paste including powdered glass and a binder from an outlet whose shape is a closed curve (an annular shape) to form a partition whose shape is a closed curve (an annular shape) of the paste over the first glass substrate so as to surround the light-emitting element; heating the partition locally so that the binder is volatilized and the powdered glass is fused to be a frit glass; and heating the frit glass locally while the frit glass and a second glass substrate are disposed in close contact with each other, so that the frit glass and the second glass substrate are welded together to form a closed space by the frit glass, the first glass substrate, and the second glass substrate to seal the light-emitting element in the closed space.

In general, the light-emitting element including an organic EL cannot withstand the heating temperature of the partition; however, such a process can be performed if only the partition can locally be heated. For local heating, a flash lamp, a laser, a rapid heater, or the like can be used. Local heating is performed twice in the process; when the amount of volatilization of the binder is as small as negligible, the local heating may be performed only once. That is, while the binder is volatilized and the powdered glass is fused to be a frit glass, the frit glass and the second glass substrate may be welded together to form a closed space by the frit glass, the first glass substrate, and the second glass substrate to seal the light-emitting element in the closed space.

Further, in the case where a terminal of an electrode is led from the light-emitting element, a step caused by the partition may be reduced in such a manner that the amount of paste is decreased or the paste is not applied at a portion overlapping with the terminal, whereby the airtightness of a resulting closed space can be increased. As a method for reducing the step, for example, a method in which the partition is formed of the paste and then a flat plate is pressed against the partition, whereby a surface of the partition is planarized, a method in which the amount of paste is reduced only over the terminal to reduce the amount of paste which is applied to the terminal portion, or the like is given.

Further, a partition of the frit glass may also be formed over the second glass substrate in addition to the first glass substrate. In that case, when local heating is performed in the state where their respective frit glasses are disposed in close contact with each other, the welding can be further easily performed, which is preferable. Alternatively, one partition provided for the first glass substrate or the second glass substrate may surround the other partition.

Note that in this specification, the paste includes powdered glass and a binder. The binder in this specification serves to increase the viscosity by jointing particles of powdered glass. Further, the frit glass in this specification is a fusion of powdered glass. Further, the rapid heater in this specification refers to a heater by which the temperature can be increased by 200° C. or higher at 10 seconds.

According to one embodiment of the present invention, a method for manufacturing a glass sealed body having a uniform partition, in which the sealing is hardly broken and a method for manufacturing a light-emitting device provided with the glass sealed body can be provided. Since such a glass sealed body is extremely strong against impact or external force, the airtightness can be maintained even when it is used under a severe environment. For example, even when a light-emitting element including an organic EL element, which is sensitive to the air including oxygen, moisture, or the like is used outdoors while being carried, the characteristics of the light-emitting device can be maintained for a long time.

BRIEF DESCRIPTION OF THE DRAWINGS

FIGS. 14A to 14E illustrate examples of electronic devices and lighting devices according to one embodiment of the present invention.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Therefore, the invention disclosed in this specification is not construed as being limited to the description of the following embodiments.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

Figure 1A:
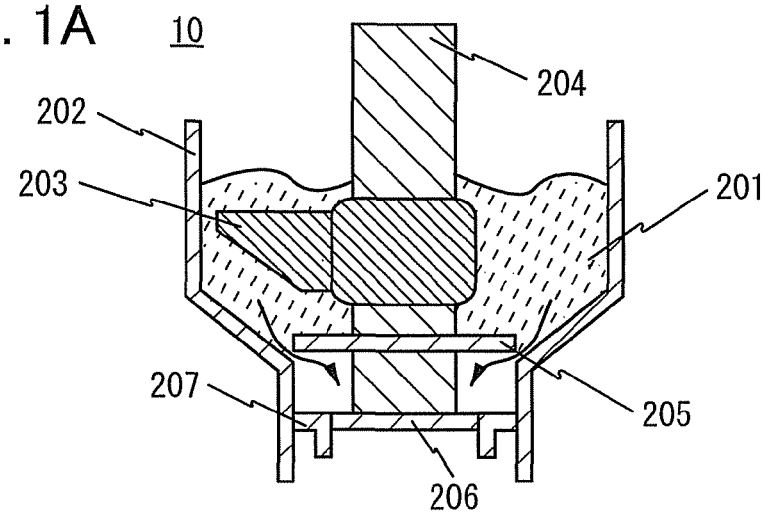
FIGS. 1A to 1C illustrate an example of a manufacturing process of a glass sealed body according to one embodiment of the present invention.
Figure 1B:
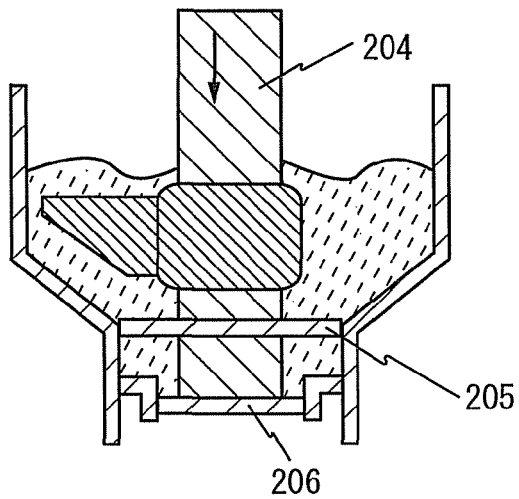
Figure 1C:
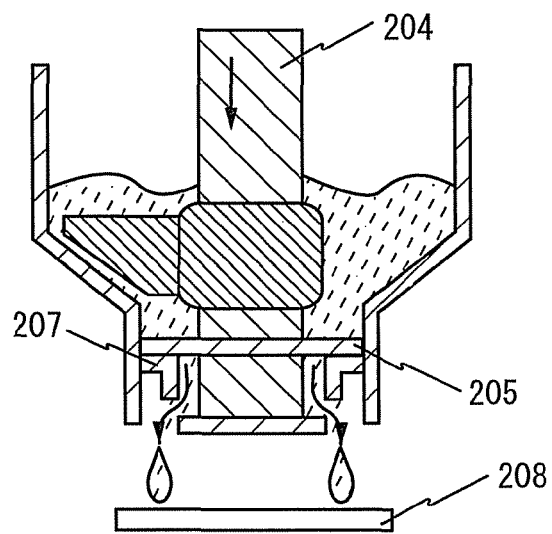

In this embodiment, one embodiment of a method for manufacturing a glass sealed body will be described with reference to FIGS. 1A to 1C, FIGS. 2A to 2C, FIGS. 3A and 3B, and FIGS. 4A and 4B. FIGS. 1A to 1C illustrate an example of a device 10 for discharging a paste formed in an annular shape. In this specification, the annular shape refers to a closed curve with a large width and may include a corner, a straight line, or the like, in addition to a curve line. A paste 201 is contained in a container 202. The paste 201 including powdered glass and a binder is mixed to be homogeneous with a stirrer 203 that rotates about a control stick 204. Although the stirrer 203 has one impeller in FIGS. 1A to 1C, it may have a plurality of impellers. Alternatively, in the case where the paste 201 is mixed in advance with an external stirrer, the stirrer can be omitted in the device 10.

It is preferable that the powdered glass include one or more compound selected from a group of, for example, magnesium oxide, calcium oxide, barium oxide, lithium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, titanium oxide, tungsten oxide, bismuth oxide, antimony oxide, lead borate glass, tin phosphate glass, vanadate glass, and borosilicate glass. For example, a resin binder diluted with an organic solvent is mixed therein, such that the power glass becomes a paste.

FIG. 1A shows a state when the paste 201 enters from a space between a partition 205 and the container 202 and reaches a partition 206 and a stopper 207. FIG. 1B shows a state when the control stick 204 is lowered a little and part of the paste 201 is confined between the partition 205 and the partition 206 and the stopper 207 at a certain amount. FIG. 1C shows a state when the control stick 204 is further lowered, in which the partition 205 is supported by the stopper 207 and a certain amount of paste formed in an annular shape is discharged from a space formed between the partition 206 and the stopper 207. The paste formed in an annular shape is dropped on a glass substrate 208 which is placed below the device 10 to faun a partition.

Figure 2A:
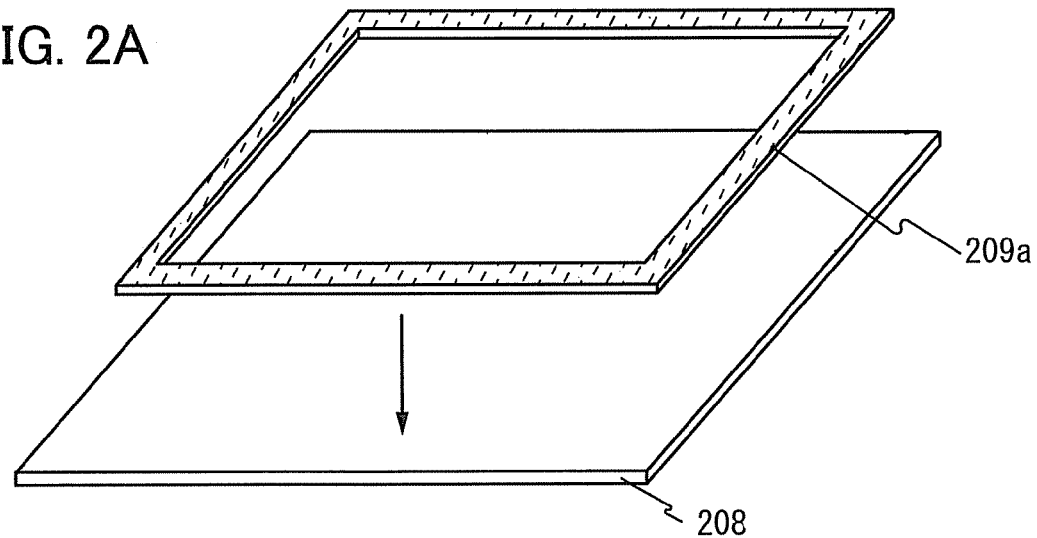
FIGS. 2A to 2C illustrate an example of a manufacturing process of a glass sealed body according to one embodiment of the present invention.

FIG. 2A illustrates an example of a paste 209a formed in an annular shape. In this example, the paste 209a has a rectangular shape, which is suitable for sealing a display device and the like; however, the paste 209a may have any shape such as a circular shape or elliptical shape as long as a closed curve is formed. The paste 209a is applied to the glass substrate 208 to form a partition 209 (see FIG. 2B).

Figure 2B:
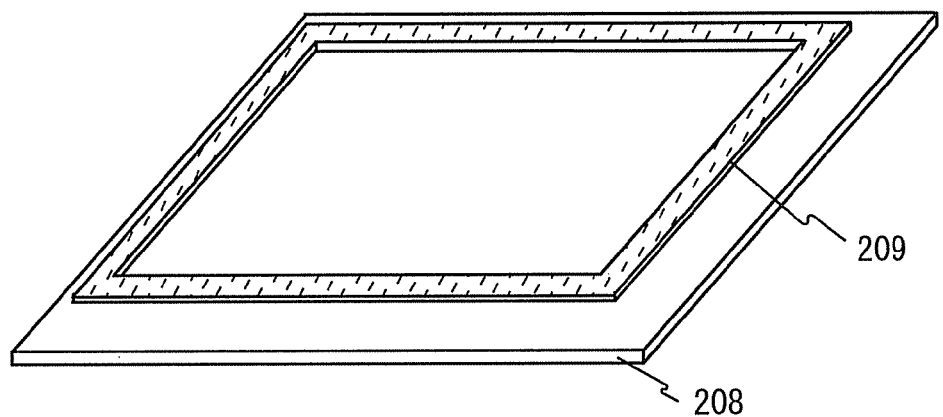

To vaporize and remove the organic solvent and the resin binder in the partition 209 in the state illustrated in FIG. 2B, the entire glass substrate 208 is heated. The heat treatment is performed using a lamp, a heater, or the like. At this time, in order to remove the organic solvent and the resin binder effectively, it is preferable that the heat treatment be performed in an atmosphere containing oxygen. This is because the organic solvent and the resin binder can be oxidized to be released as carbon dioxide. The powdered glass is melted and solidified through the heat treatment, whereby the powdered glass is fused, so that the partition 209 can be a frit glass. Alternatively, the heat treatment may be performed using a flash lamp. With the use of the flash lamp, heat can be applied only to the partition 209; therefore, this method is effective not to heat the glass substrate 208. For example, there is a case where an organic EL element is provided over the glass substrate 208. Further, since the flash lamp has a large-area light source, the entire partition 209 can be heated at the same time. Such treatment is further preferable because stress is not likely to be accumulated in the partition 209.

Figure 2C:
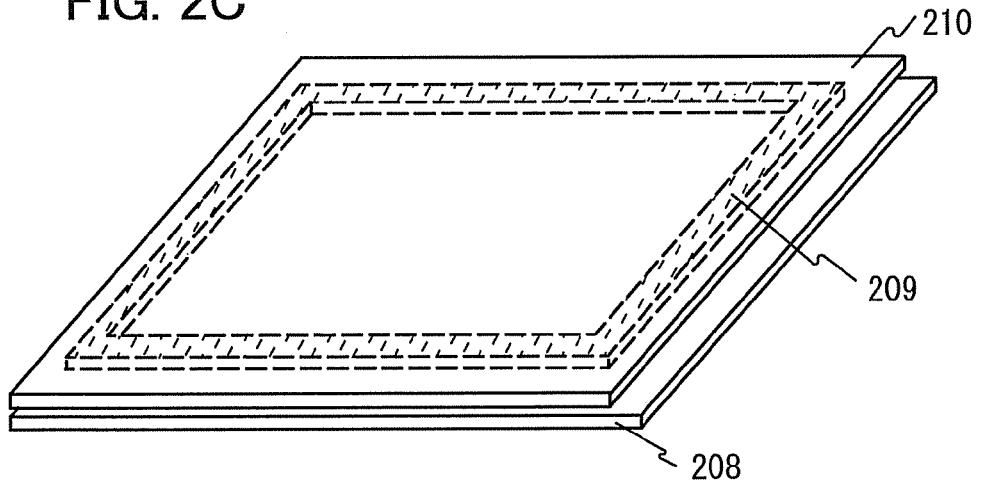
Figure 3A:
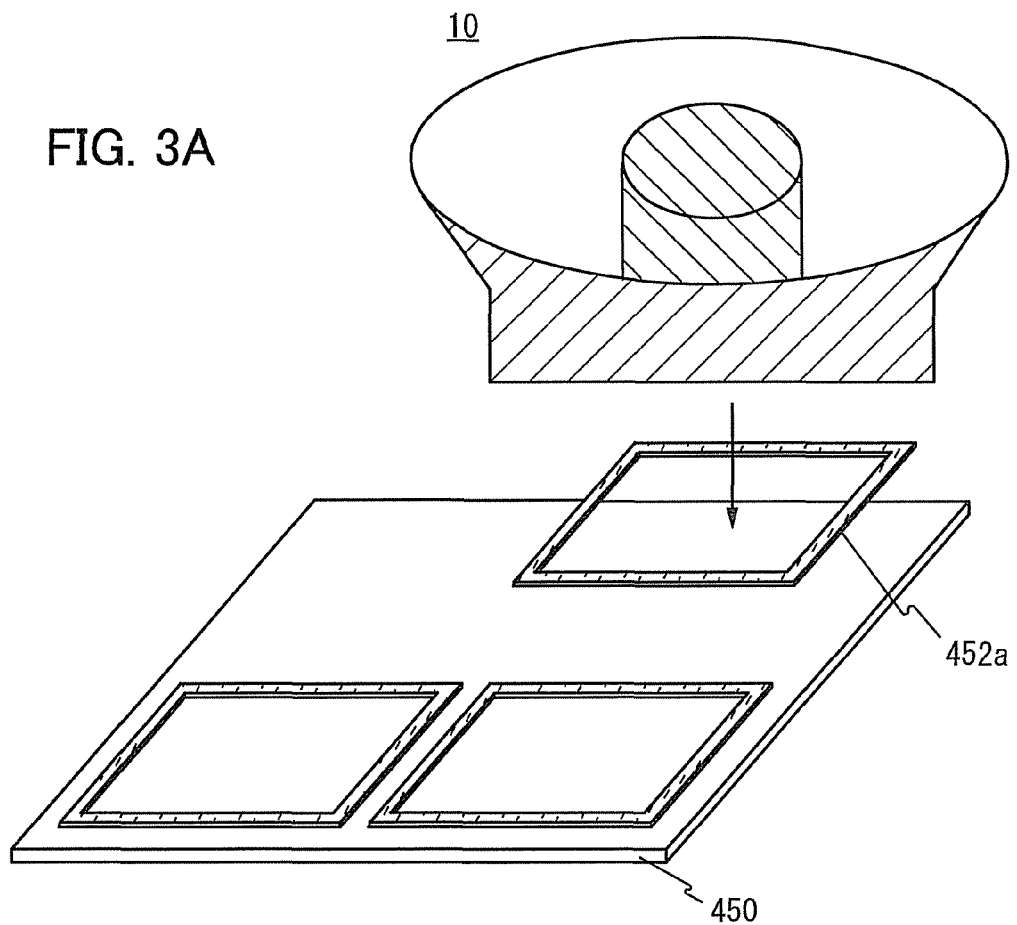
FIGS. 3A and 3B illustrate an example of a manufacturing process of a glass sealed body according to one embodiment of the present invention.
Figure 3B:
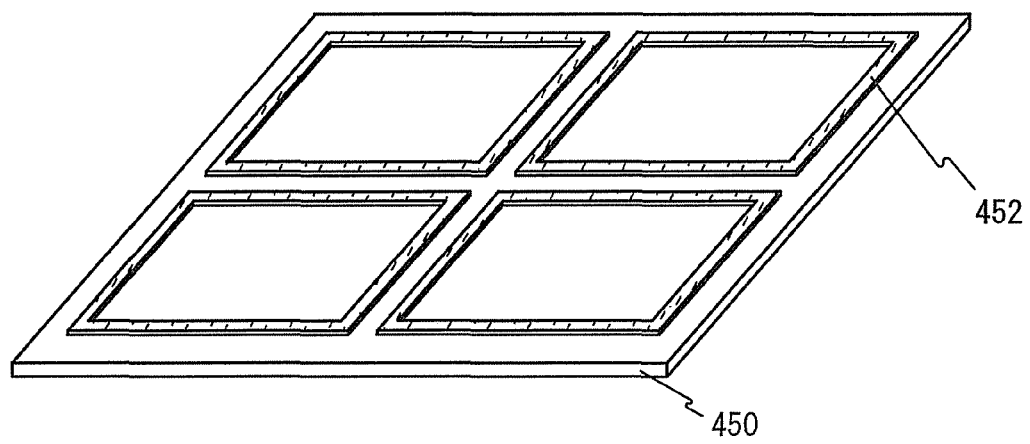
Figure 4A:
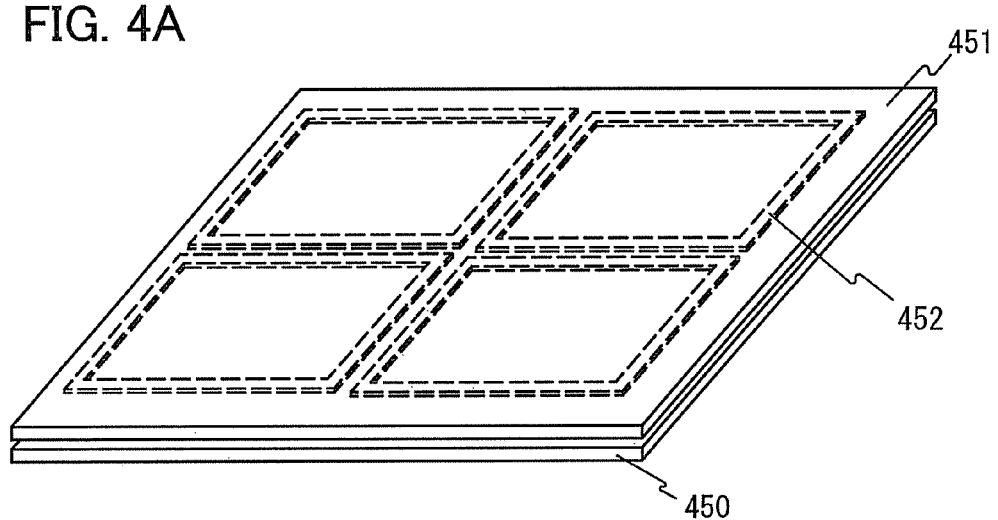
FIGS. 4A and 4B illustrate an example of a manufacturing process of a glass sealed body according to one embodiment of the present invention.
Figure 4B:
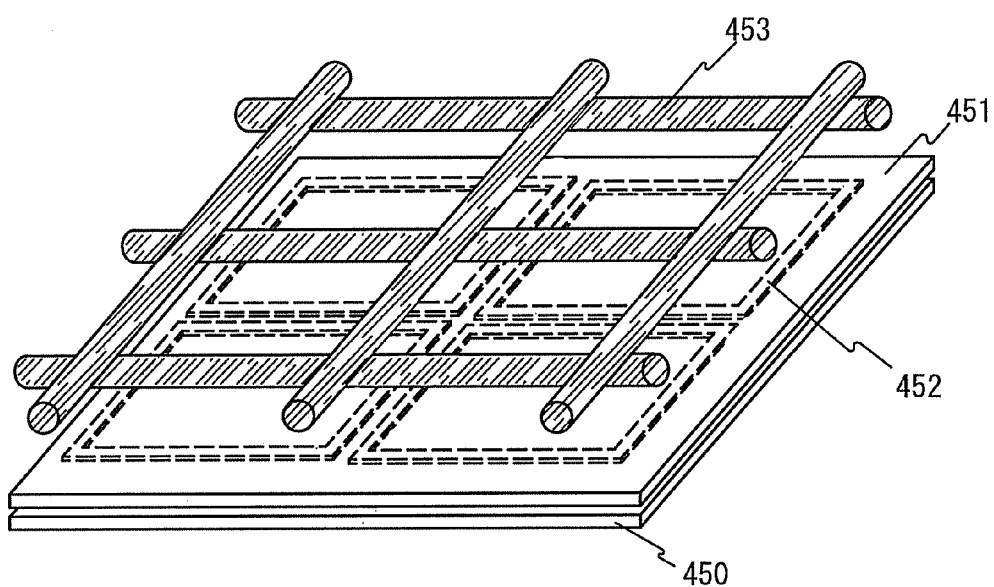

After that, a glass substrate 210 and the partition 209 are disposed in close contact with each other (see FIG. 2C) under a desired atmosphere and heat treatment is performed thereon, so that they are welded together to form the glass sealed body. The heat treatment is performed using a lamp, a heater, or the like. Further, the frit glass may be instantly melted and solidified by irradiation with lamp light of a flash lamp in the state where the glass substrate 210 and the partition 209 are disposed in close contact with each other. The preferable atmosphere is, for example, an atmosphere with a small amount of moisture or oxygen although it also depends on characteristics of the device to be sealed. For example, dry nitrogen or another dry gas may be used; typically, an inert gas may be used. Alternatively, a mixed gas of any of these gases may be used. The flash lamp is placed along the partition 209 so that the partition 209 is irradiated with lamp light of a flash lamp light at a high energy density. Further, in order to increase the energy density, light may be collected to the partition 209 using a cylindrical mirror or lens. These structural examples will be described later. It is preferable that the flash lamp have a suitable shape for the partition. In the case where the partition has a rectangular shape as illustrated in FIGS. 2A to 2C, for example, a rectangle is formed using four elongated cylindrical flash lamps.

As the flash lamp, for example, a flash lamp whose light-emitting pipe includes one or more of a rare gas such as xenon, krypton, and argon therein, is used. With the use of the flash lamp, for example, light having a wavelength of greater than or equal to 200 nm and less than or equal to 1100 nm is emitted. The lamp can have the light emission time of greater than or equal to 10 μs and less than or equal to 10 ms or greater than or equal to 100 μs and less than or equal to 10 ms and is suitable for giving high energy locally. Further, since the length of the light-emitting pipe can be greater than or equal to 1 m, for example, a large-sized glass sealed body can be manufactured. The best feature of this process is in that the entire partition 209 can be melted and solidified concurrently. Therefore, stress hardly remains in the closed space formed by the partition 209, and the glass substrate 208 and the glass substrate 210 which are attached to thereto; thus, the glass sealed body which is strong extremely against external force such as impact, distortion, or the like, can be obtained. This effect remarkably appears particularly in the case where organic EL lighting or display devices using organic EL, which are used for a long time, are sealed in the glass sealed body. Note that, for local heating, a laser, a rapid heater, or the like as well as the flash lamp can be used.

Next, a manufacturing example of a plurality of glass sealed bodies will be described with reference to FIGS. 3A and 3B and FIGS. 4A and 4B. First, a paste 452a formed in an annular shape is discharged from the device 10 (see FIG. 3A) and thus a plurality of partitions 452 is formed on a glass substrate 450 (see FIG. 3B). The number of partitions 452 is not limited. The partition 452 is formed using the device 10; therefore, it is formed in an annular shape without a joint portion. The partitions 452 are subjected to heat treatment to be a frit glass. Next, heat treatment is performed in the state where a glass substrate 451 and the partitions 452 are disposed in close contact with each other under a desired atmosphere (see FIG. 4A). The heat treatment can be performed with a heater, a lamp, a laser, or the like. Alternatively, a flash lamp as described above may be used. When elongated cylindrical flash lamps 453 are placed in grid, light can be irradiated along the partitions 452 (see FIG. 4B). At this time, an adhesive may be applied between each of the partitions 452 or to the periphery of the glass substrate 450, whereby the glass substrate 450 and the glass substrate 451 are temporarily fixed. With such a structure, the atmosphere in the closed spaces formed by the partitions 452, the glass substrate 450, and the glass substrate 451 can be temporarily trapped in the closed spaces and irradiation with lamp light of the flash lamps 453 can be performed in the air; thus, the device structure can be simplified, which is preferable. This is an effective method even when the number of partitions is one. Further, the plurality of glass substrates 451 may be used in accordance with the number of partitions 452. With such a structure, the plurality of glass sealed bodies can be easily separated. For the separation, for example, a laser scriber or the like is used.

As described above, there is not a joint portion in the partition of the glass sealed body according to one embodiment of the present invention; accordingly, a glass sealed body which is strong against external force such as impact, distortion, or the like according to this embodiment can be provided. Accordingly, a device protected by the glass sealed body can maintain the performance for a long time.

The methods and structures described in this embodiment can be combined as appropriate with any of the methods and structures described in the other embodiments.

Embodiment 2

A method for manufacturing a light-emitting device which is one embodiment of the present invention and includes the glass sealed body described in Embodiment 1 will be described with reference to FIGS. 5A to 5C and FIGS. 6A to 6C.

A light-emitting element such as an organic EL element includes an electrode for supplying power and a terminal can be led from the electrode to be connected to an external power source. However, a projected portion is formed in a position where the terminal is provided; therefore, airtightness of sealing may become worse. An example of a method for suppressing an adverse effect due to the projected portion will be described with reference to FIGS. 6A to 6C.

Figure 5A:
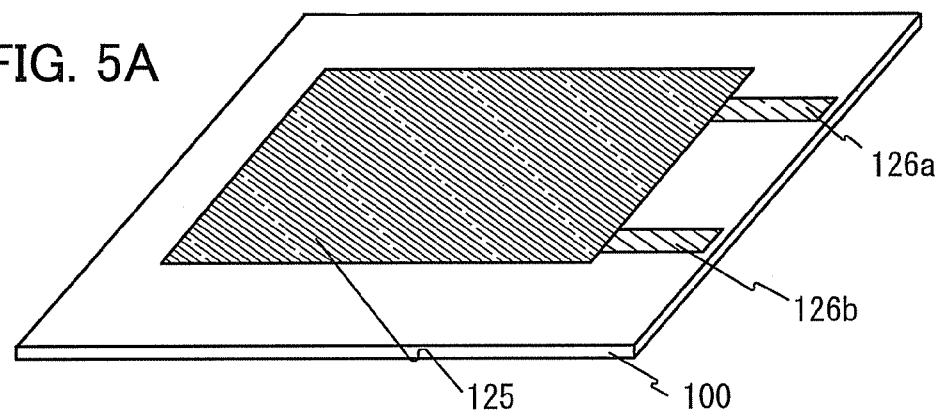
FIGS. 5A to 5C illustrate an example of a manufacturing process of a glass sealed body according to one embodiment of the present invention.

First, as illustrated in FIG. 5A, an organic EL element 125 is provided over a glass substrate 100. The organic EL element 125 has a stacked structure in which an anode, a light-emitting layer, and a cathode are stacked in this order over the glass substrate 100, for example. Note that the order of the anode and the cathode may be changed. Further, another layer may be provided in addition to the above. Terminals 126a and 126b are led from the anode and the cathode, respectively, and they are connected to an external power source, whereby power can be supplied to the organic EL element 125.

Figure 5B:
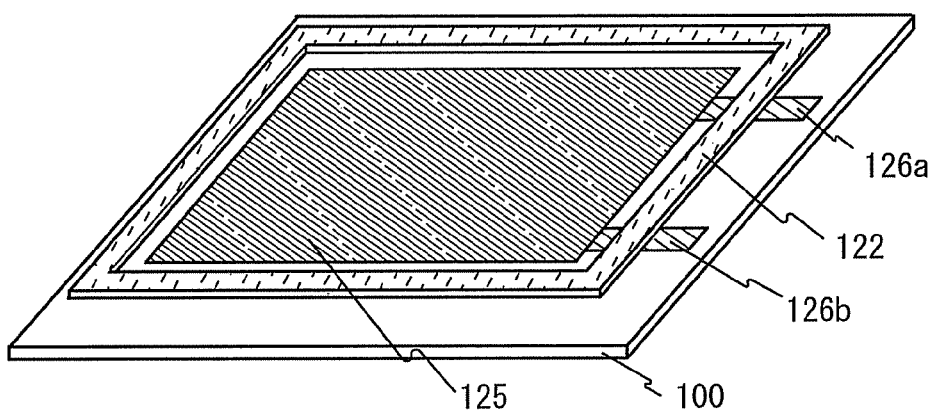

Next, as illustrated in FIG. 5B, a partition 122 is formed by the method described in Embodiment 1. The partition 122 is formed so as to surround the organic EL element 125, and the terminals 126a and 126b are led to the outside of the partition 122 whose shape is a closed curve.

In general, each of the terminals 126a and 126b has more than a few thickness (typically, about greater than or equal to several tens of nanometers and less than or equal to several tens of micrometers); therefore, a portion where the adhesion between the partition 122 and the glass substrate 100 becomes worse may be generated. In addition, the planarity of an uppermost surface of the partition 122 is accordingly deteriorated. In order to suppress such a problem, for example, a method illustrated in FIGS. 6B and 6C is preferably used.

Figure 6A:
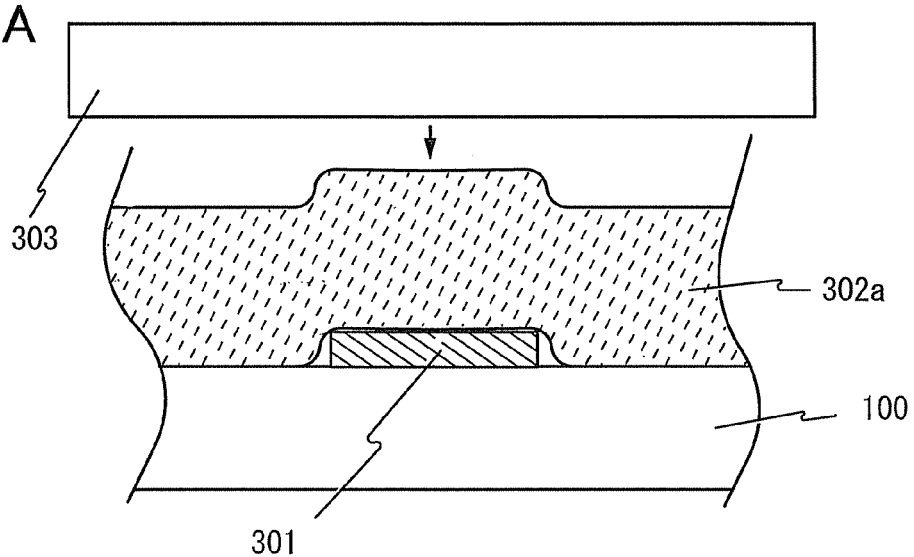
FIGS. 6A to 6C illustrate an example of a manufacturing process of a glass sealed body according to one embodiment of the present invention.

Specifically, when a terminal 301 is provided over the glass substrate 100 and a partition 302a is formed so as to cross the terminal 301, as shown in FIG. 6A, a space may be formed between the partition 302a and the terminal 301 or a projected portion may be formed at a portion of the partition 302a overlapping with the terminal 301. Since the space may cause significant deterioration of the airtightness of the glass sealed body, it needs to be as small as possible. Further, similarly, since the projected portion of the partition 302a causes a space between the partition 302a and the substrate which is welded thereover, it also needs to be as small as possible.

Figure 5C:
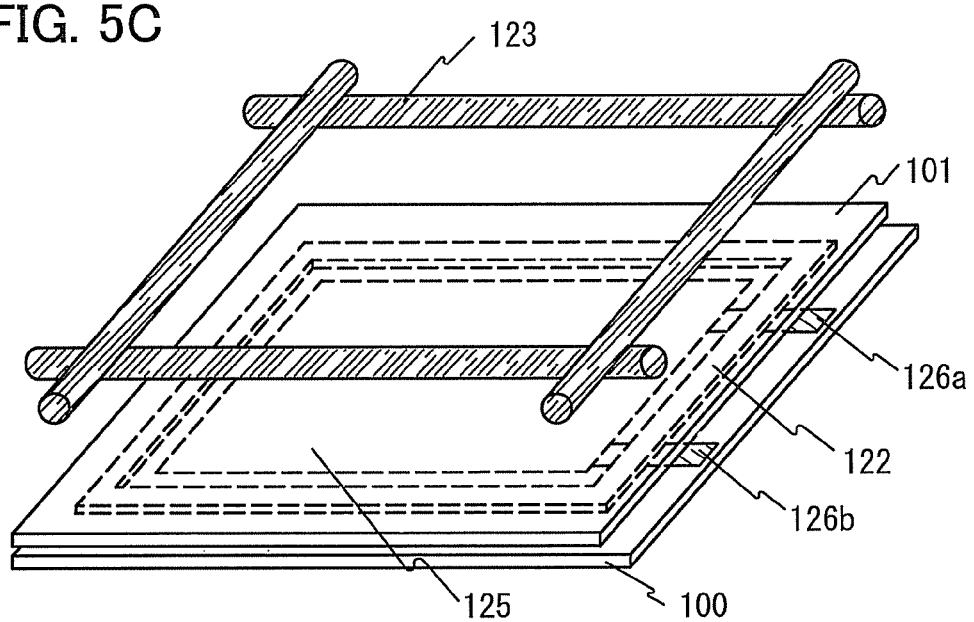
Figure 6B:
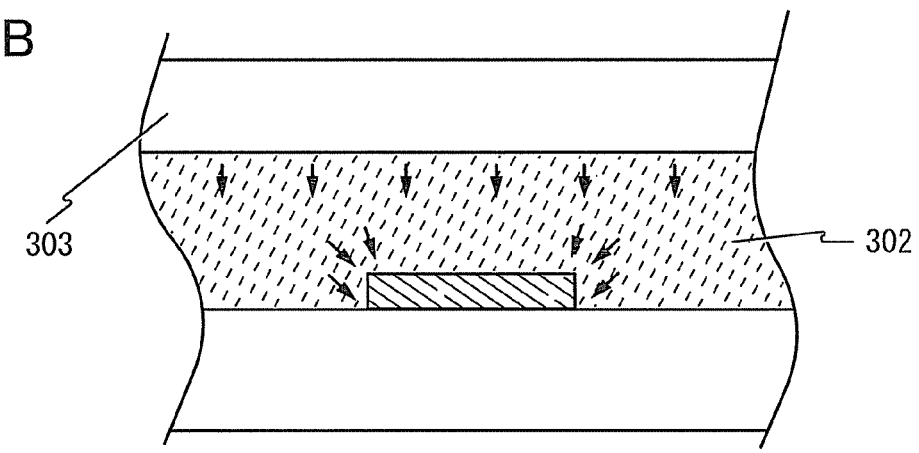
Figure 6C:
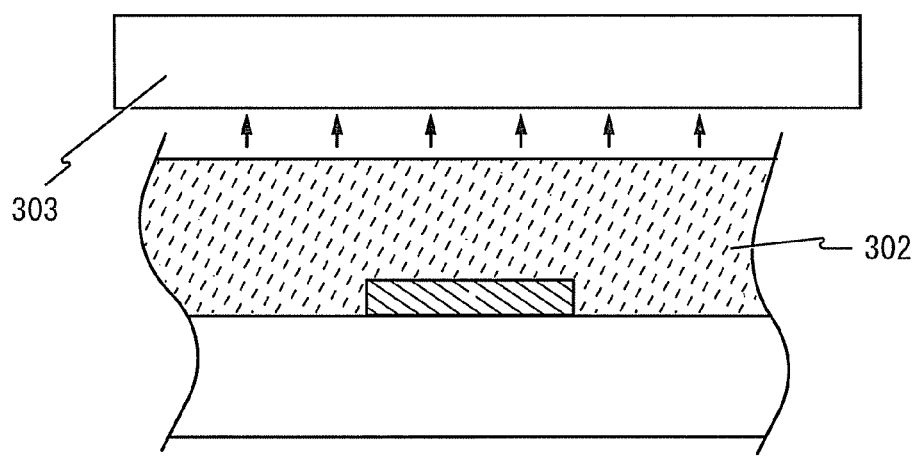

For example, as illustrated in FIG. 6B, before the partition 302a is heated, a flat plate 303 is pressed against the partition 302a, whereby the shape of the partition 302a is changed to form a partition 302. The partition 302a has high flexibility because it is not heated yet; therefore, such a process can be performed thereon. Through this process, the space between the partition 302a and the terminal 301 or the projected portion formed in an uppermost surface of the partition 302a is reduced or is removed. After that, the flat plate 303 is separated from the partition 302, so that the shape of the partition 302 is kept. In the case where the material of the flat plate 303 is different from that of the partition 302, the adhesion is poor; therefore, the heat treatment may be performed while the flat plate 303 is pressed against the partition 302. As shown in FIGS. 5A to 5C, the organic EL element 125 which is sensitive to heat is formed over the glass substrate 100. Therefore, it is necessary to obtain a frit glass in such a manner that the partition 122 is locally heated so that a binder included in the partition 122 is volatilized and further the powdered glass is fused. The use of a flash lamp is one of effective methods for local heating; therefore, here, an example of heat treatment with the use of a flash lamp will be described.

At this time, the flat plate 303 needs to have a light-transmitting property with respect to lamp light of a flash lamp; for example, a plastic substrate or the like can be given. Further, in the case where the glass substrate 100 and the terminal 301 have the light-transmitting property, irradiation with lamp light of a flash lamp may be performed from the bottom of the glass substrate 100. In that case, the flat plate 303 does not necessarily have a light-transmitting property; therefore, even a material having poor adhesion to the frit glass, for example, metal or ceramics, can be used. Note that, when the projected portions of the terminals 126a and 126b are as small as negligible, the process illustrated in FIGS. 6B and 6C can be skipped.

Further, the partition 122 may be provided not on the surface of the glass substrate 100 but on the surface of the glass substrate 101 and further a depressed portion which engages with the projected portion of the terminal may be in advance provided in the partition 122. For example, before the partition 122 is heated, the projected portion of the terminal or an object having the same shape as the projected portion of the terminal is pressed against the partition 122, whereby the depressed portion can be easily formed. Of course, when the projected portions of the terminals 126a and 126b are as small as negligible, the process for forming the depressed portions can be skipped. Since the organic EL element is not provided on the surface of the glass substrate 101 when the partition 122 is heated, heat needs not be locally applied; therefore, a heater, a lamp, or the like, may be used. Furthermore, the partition 122 may be provided for both of the glass substrate 100 and the glass substrate 101. Then, irradiation with lamp light of a flash lamp may be performed in the state where their respective frit glasses are disposed in close contact with each other, whereby the welding can be further easily performed. Alternatively, one partition provided for the glass substrate 100 or the glass substrate 101 may surround the other partition.

After that, as illustrated in FIG. 5C, the partition 122 is melted and then solidified by irradiation with lamp light of a flash lamp 123, for example, in the state where the glass substrate 101 is pressed against the partition 122, whereby the glass substrate 101 and the partition 122 are welded together. The preferable atmosphere is an atmosphere in which a substance which is harmful to the organic EL element, for example, moisture or oxygen, is removed as much as possible. Specifically, dry nitrogen, another inert gas with a small amount of moisture, or the like, may be used. Further, the glass substrate 101 is smaller than the glass substrate 100. With such a structure, the terminals 126a and 126b can be exposed; therefore, they can be easily connected to an external power source. Note that, for local heating, a laser or a rapid heater as well as the flash lamp can be used.

As described above, there is not a joint portion in the partition of the glass sealed body according to one embodiment of the present invention; accordingly, a light-emitting device which is strong against external force such as impact, distortion or the like according to this embodiment can be provided. Accordingly, the light-emitting device can maintain the performance for a long time.

The methods and structures described in this embodiment can be combined as appropriate with any of the methods and structures described in the other embodiments.

Embodiment 3

Figure 7A:
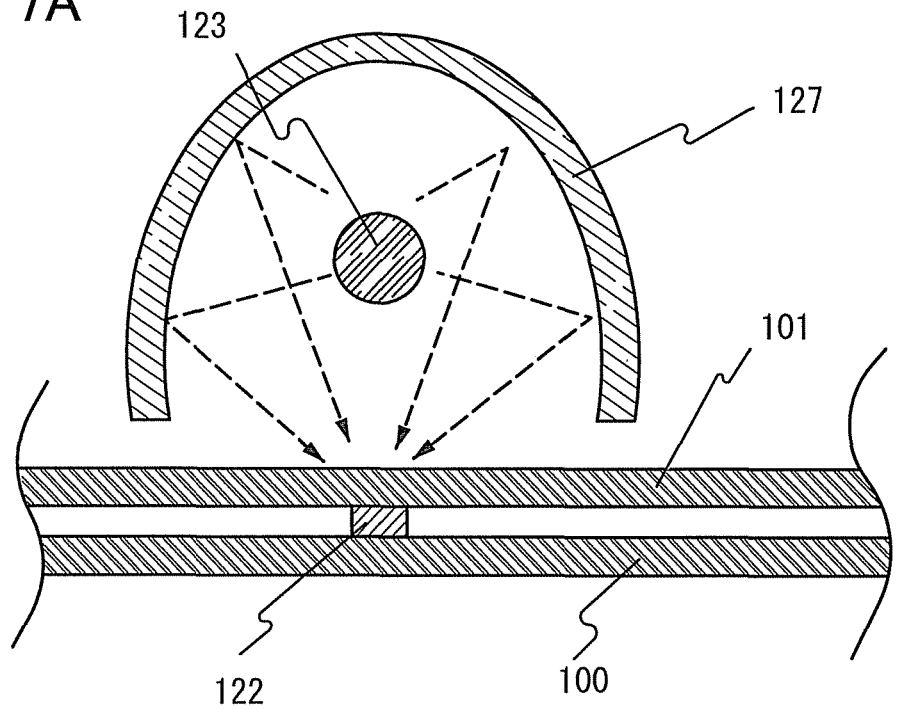
FIGS. 7A and 7B illustrate examples of optical systems applied to a flash lamp according to one embodiment of the present invention.
Figure 7B:
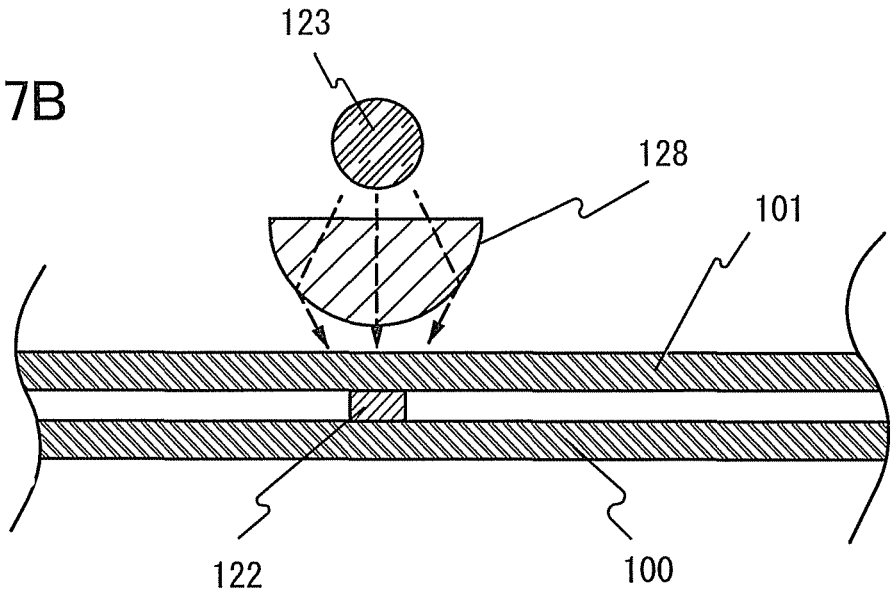

Examples of optical systems applied to the flash lamp described in the above embodiments will be described with reference to FIGS. 7A and 7B. In FIGS. 7A and 7B, the partition 122 without a joint portion according to one embodiment of the present invention is formed over the glass substrate 100 and the state where the glass substrate 101 and the partition 122 are disposed in close contact with each other is shown.

As illustrated in FIG. 7A, the flash lamp 123 is covered with a cylindrical mirror 127, whereby light which is extended to the surroundings can be collected in one direction. For example, the cross-sectional shape of the cylindrical mirror 127 in a direction parallel to the drawing of FIGS. 7A and 7B is an ellipse. Further, the flash lamp 123 is placed at a focal point of the ellipse and the partition 122 is placed at the other focal point of the ellipse, whereby light can be effectively collected to the partition 122.

As another example, as illustrated in FIG. 7B, a convex lens 128 may be provided between the flash lamp 123 and the partition 122 so that light which is extended is converged. Further, the mirror 127 and the convex lens 128 may be used in combination. When the flash lamp 123 emits light with the use of such an optical system, the partition 122 and the glass substrate 101 can be welded together with low energy.

When the partition 122 without a joint portion and the flash lamp described in this embodiment are used in combination, the entire partition 122 can be heated at the same time and distortion hardly occurs at the time of welding; accordingly, a glass sealed body which is strong against external force such as impact, distortion or the like according to this embodiment can be provided. Accordingly, a device protected by the glass sealed body can maintain the performance for a long time.

The methods and structures described in this embodiment can be combined as appropriate with any of the methods and structures described in the other embodiments.

Embodiment 4

Figure 8A:
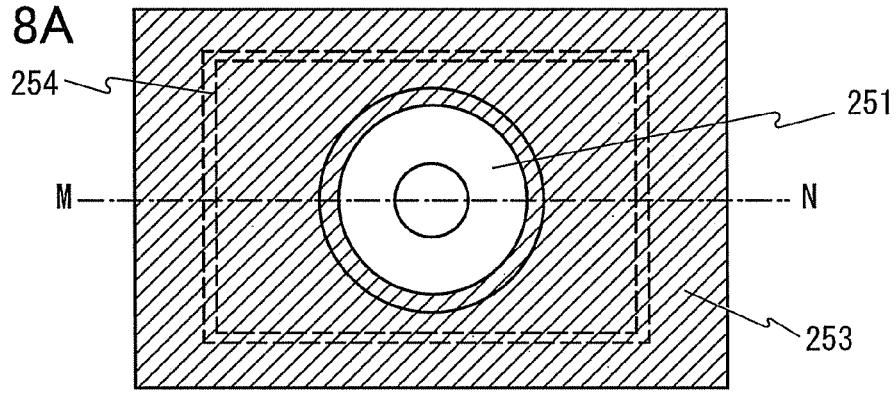
FIGS. 8A to 8C illustrate an example of a manufacturing process of a glass sealed body according to one embodiment of the present invention.
Figure 8B:
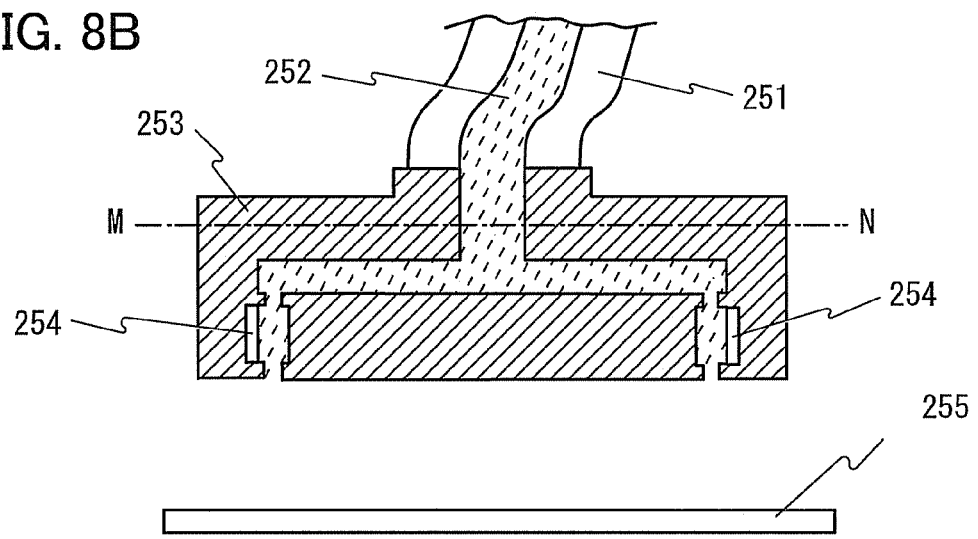
Figure 8C:
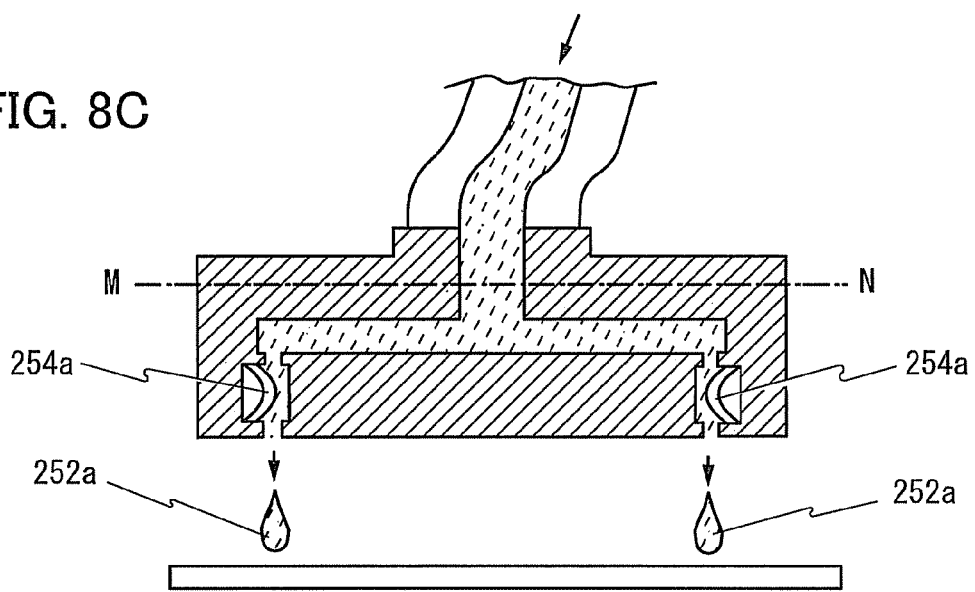

In this embodiment, FIGS. 8A to 8C illustrate another example of the device for discharging a paste formed in an annular shape described in the above embodiment.

FIG. 8A is a plan view, and FIG. 8B is a cross-sectional view taken along a chain line M-N of FIG. 8A. A pipe 251 is connected to a dispensing apparatus (not shown) by which a paste 252 is supplied to an annular nozzle 253. The nozzle 253 is filled with the paste 252 by the dispensing apparatus. After that, by application of voltage to a piezoelectric element 254 placed in an annular shape, the piezoelectric element 254 is changed in shape to become a piezoelectric element 254a, whereby a paste 252a formed in an annular shape is discharged (see FIG. 8C). The amount of paste to be discharged can be controlled by voltage applied to the piezoelectric element 254; therefore, an optimal amount of paste to be discharged can be selected. In this manner, a partition of a closed curve is formed over a glass substrate 255. In FIGS. 8A to 8C, although the piezoelectric element 254 is illustrated as a single body, the piezoelectric element 254 may be minutely divided into a plurality of elements and the plurality of elements may be placed in an annular shape. In this manner, the level of the change in shape of the piezoelectric element 254 can be locally changed; therefore, the amount of paste to be discharged can be locally changed. Accordingly, for example, the amount of paste to be discharged is reduced over the terminals 126a and 126b of the electrodes described in Embodiment 2, whereby the planarity of the surface of the partition 122 or the like can be improved. In this embodiment, the paste 252a has a rectangular shape; however, the paste 252a may be another closed curve. After that, the glass sealed body is formed by the method described in the above embodiment.

As described above, there is not a joint portion in the partition of the glass sealed body according to one embodiment of the present invention; accordingly, a glass sealed body which is strong against external force such as impact, distortion or the like according to this embodiment can be provided. Accordingly, a device protected by the glass sealed body can maintain the performance for a long time.

The methods and structures described in this embodiment can be combined as appropriate with any of the methods and structures described in the other embodiments.

Embodiment 5

Figure 9A:
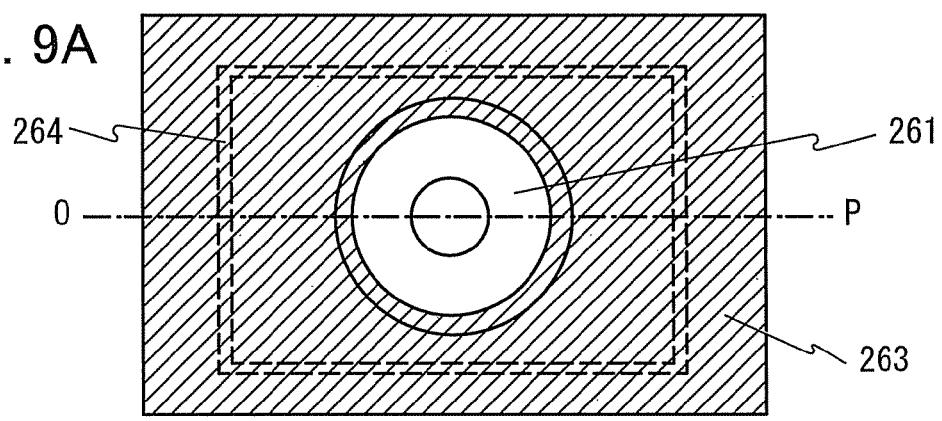
FIGS. 9A to 9C illustrate an example of a manufacturing process of a glass sealed body according to one embodiment of the present invention.
Figure 9B:
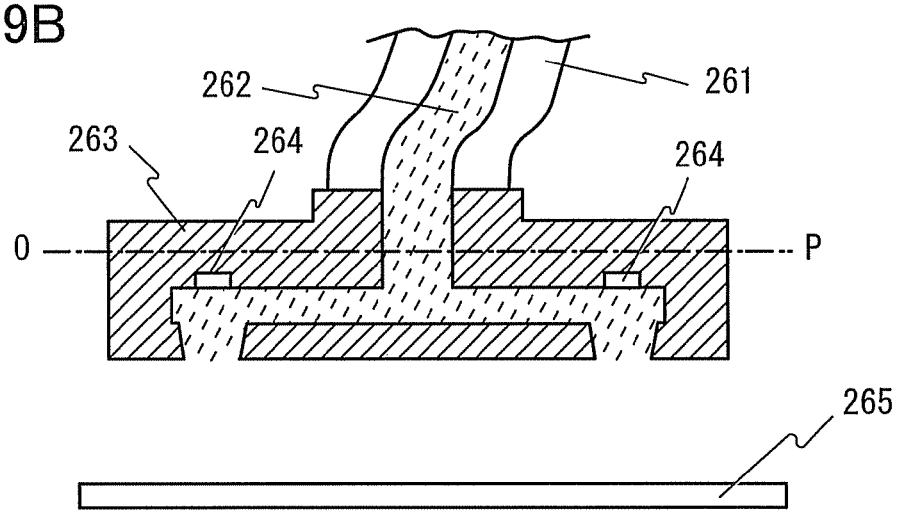
Figure 9C:
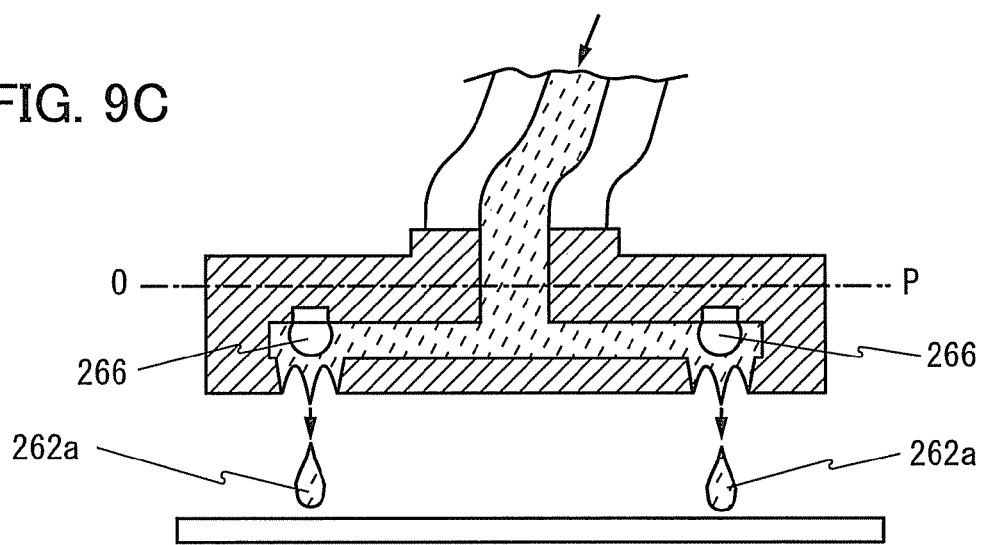

In this embodiment, FIGS. 9A to 9C illustrate another example of the device for discharging a paste formed in an annular shape described in the above embodiment.

FIG. 9A is a plan view, and FIG. 9B is a cross-sectional view taken along a chain line O-P of FIG. 9A. A pipe 261 is connected to a dispensing apparatus (not shown) by which a paste 262 is supplied to an annular nozzle 263. The nozzle 263 is filled with the paste 262 by the dispensing apparatus. After that, by heating a rapid heater 264 placed in an annular shape, a bubble 266 is formed in the paste 262 around the rapid heater 264, whereby a paste 262a formed in an annular shape is discharged (see FIG. 9C). In this manner, a partition of a closed curve is formed over a glass substrate 265. In FIGS. 9A to 9C, although the rapid heater 264 is illustrated as a single body, the rapid heater 264 may be minutely divided into a plurality of rapid heaters and the plurality of rapid heaters may be placed in an annular shape. In this manner, the heating temperature of the rapid heater 264 can be locally changed; therefore, the amount of paste to be discharged can be locally changed. Accordingly, for example, the amount of paste to be discharged is reduced over the terminals 126a and 126b of the electrodes described in Embodiment 2, whereby the planarity of the surface of the partition 122 or the like can be improved. In this embodiment, the paste 262a has a rectangular shape; however, the paste 262a may be another closed curve. After that, the glass sealed body is formed by the method described in the above embodiment.

As described above, there is not a joint portion in the partition of the glass sealed body according to one embodiment of the present invention; accordingly, a glass sealed body which is strong against external force such as impact, distortion or the like according to this embodiment can be provided. Accordingly, a device protected by the glass sealed body can maintain the performance for a long time.

The methods and structures described in this embodiment can be combined as appropriate with any of the methods and structures described in the other embodiments.

Embodiment 6

Figure 10A:
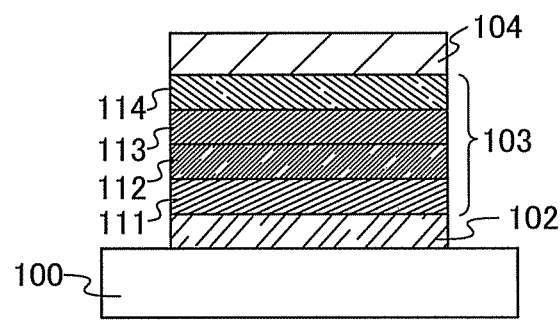
FIGS. 10A and 10B are conceptual diagrams of light-emitting elements according to one embodiment of the present invention.

One embodiment of the organic EL element 125 described in Embodiment 2 will be described with reference to FIG. 10A. For easy understanding, the terminals 126a and 126b are not described.

The light-emitting element includes a pair of electrodes (a first electrode 102 and a second electrode 104) and an organic EL layer 103 interposed between the pair of electrodes. The light-emitting element described in this embodiment is provided over a glass substrate 100.

The glass substrate 100 is used as a support of the light-emitting element. As the glass substrate 100, it is needless to say that a rectangular plate-like substrate can be used, and substrates having a variety of shapes, such as a shape having a curved surface, can be used.

One of the first electrode 102 and the second electrode 104 serves as an anode and the other serves as a cathode. In this embodiment, the first electrode 102 is used as the anode and the second electrode 104 is used as the cathode; however, the present invention is not limited to this structure.

It is preferable to use a metal, an alloy, or a conductive compound, a mixture thereof, or the like having a high work function (specifically, more than or equal to 4.0 eV) as a material for the anode. Specific examples include indium oxide-tin oxide (ITO: indium tin oxide), indium oxide-tin oxide containing silicon or silicon oxide, indium oxide-zinc oxide, tungsten oxide-indium oxide containing zinc oxide, and the like. In addition, gold (Au), platinum (Pt), nickel (Ni), tungsten (W), chromium (Cr), molybdenum (Mo), iron (Fe), cobalt (Co), copper (Cu), palladium (Pd), a nitride of a metal material (such as titanium nitride), or the like can be used.

It is preferable to use a metal, an alloy, or a conductive compound, a mixture thereof, or the like having a low work function (specifically, less than or equal to 3.8 eV) as a material for the cathode: Specifically, an element belonging to Group 1 or Group 2 of the periodic table, that is, an alkali metal such as lithium (Li) and cesium (Cs), an alkaline earth metal such as calcium (Ca) and strontium (Sr), and magnesium (Mg) can be given. Further, an alloy containing an alkali metal or an alkaline earth metal (e.g., MgAg or AlLi) can be used. Moreover, a rare earth metal such as europium (Eu) or ytterbium (Yb), or an alloy containing a rare earth metal can also be used. In the case where an electron-injection layer in contact with the second electrode 104 is provided as part of the organic EL layer 103, the second electrode 104 can be formed using a variety of conductive materials such as Al, Ag, or ITO, regardless of their work functions. A thin film can be formed of any of these conductive materials by a sputtering method, an ink-jet method, a spin coating method, or the like.

Although the organic EL layer 103 can be formed to have a single-layer structure, it is normally formed to have a stacked-layer structure. There is no particular limitation on the stacked-layer structure of the organic EL layer 103. The organic EL layer 103 may be formed by combining, as appropriate, a layer containing a substance having a high electron-transport property (electron-transport layer) or a layer containing a substance having a high hole-transport property (hole-transport layer), a layer containing a substance having a high electron-injection property (electron-injection layer), a layer containing a substance having a high hole-injection property (hole-injection layer), a layer containing a bipolar substance (substance having high electron- and hole-transport properties), a layer containing a light-emitting material (light-emitting layer), and the like. For example, the organic EL layer 103 can be formed in an appropriate combination of a hole-injection layer, a hole-transport layer, a light-emitting layer, an electron-transport layer, an electron-injection layer, and the like. FIG. 10A illustrates as the organic EL layer 103 formed over the first electrode 102, a structure in which a hole-injection layer 111, a hole-transport layer 112, a light-emitting layer 113, and an electron-transport layer 114 are sequentially stacked.

A light-emitting element emits light when current flows due to a potential difference generated between the first electrode 102 and the second electrode 104, and holes and electrons are recombined in the light-emitting layer 113 containing a substance having a high light-emitting property. That is, a light-emitting region is formed in the light-emitting layer 113.

The emitted light is extracted out through one or both of the first electrode 102 and the second electrode 104. Therefore, one or both of the first electrode 102 and the second electrode 104 have a light-transmitting property. In the case where only the first electrode 102 has a light-transmitting property, light is extracted from a substrate side through the first electrode 102. Meanwhile, in the case where only the second electrode 104 has a light-transmitting property, light is extracted from the side opposite to the substrate side through the second electrode 104. In the case where each of the first electrode 102 and the second electrode 104 has a light-transmitting property, light is extracted from both of the substrate side and the side opposite to the substrate side through the first electrode 102 and the second electrode 104.

In order to suppress energy transfer from an exciton which is generated in the light-emitting layer 113, the hole-transport layer 112 or the electron-transport layer 114 which is in contact with the light-emitting layer 113, particularly a carrier-(electron- or hole-) transport layer in contact with a side closer to a light-emitting region in the light-emitting layer 113, is preferably formed using a substance having an energy gap larger than an energy gap of a light-emitting material included in the light-emitting layer or an energy gap of an emission center substance included in the light-emitting layer.

The hole-injection layer 111 contains a substance having a high hole-injection property, and has a function of helping injection of holes from the first electrode 102 to the hole-transport layer 112. For the hole-injection layer 111, a substance in which a difference in ionization potential between the first electrode 102 and the hole-transport layer 112 is relieved and thus holes are easily injected, is selected. Specifically, it is preferable that the hole-injection layer 111 be formed using a substance having an ionization potential lower than the hole-transport layer 112 but higher than the first electrode 102, or a substance by which the energy band is bent when being provided as a thin film with a thickness of 1 nm to 2 nm between the hole-transport layer 112 and the first electrode 102. Specific examples of substances having a high hole-injection property include phthalocyanine (abbreviation: $H_2Pc$), a phthalocyanine-based compound such as copper phthalocyanine (abbreviation: CuPc), a high molecular compound such as poly(ethylenedioxythiophene)/poly(styrenesulfonate)aqueous solution (PEDOT/PSS), and the like.

The hole-transport layer 112 is a layer containing a substance having a high hole-transport property. Note that a substance having a high hole-transport property refers to a substance having higher mobility of holes than that of electrons and a substance having a ratio value of hole mobility to electron mobility (=hole mobility/electron mobility) of more than 100 is preferably used. The hole-transport layer 112 preferably has a hole mobility of greater than or equal to $1 \times 10^{-6}$ $cm^2/Vs$. Specific examples of substances having a high hole-transport property include 4,4'-bis[N-(1-naphthyl)-N-phenylamino]biphenyl (abbreviation: NPB), 4,4'-bis[N-(3-methylphenyl)-N-phenylamino]biphenyl (abbreviation: PD), 4,4',4''-tris(N,N-diphenylamino)triphenylamine (abbreviation: TDATA), 4,4',4''-tris[N-(3-methylphenyl)-N-phenylamino]triphenylamine (abbreviation: MTDATA), 4,4'-bis{N-[4-(N,N-di-m-tolylamino)phenyl]-N-phenylamino}biphenyl (abbreviation: DNTPD), 1,3,5-tris[N,N-di(m-tolyl)amino]benzene (abbreviation: m-MTDAB), 4,4',4''-tris(N-carbazolyl)triphenylamine (abbreviation: TCTA), phthalocyanine (abbreviation: $H_2Pc$), copper phthalocyanine (abbreviation: CuPc), vanadyl phthalocyanine (abbreviation: VOPc), and the like. Note that the hole-transport layer 112 may have a single-layer structure or a stacked-layer structure.

The electron-transport layer 114 is a layer containing a substance having a high electron-transport property. Note that a substance having a high electron-transport property refers to a substance having higher mobility of electrons than that of holes and a substance having a ratio value of electron mobility to hole mobility (=electron mobility/hole mobility) of more than 100 is preferably used. The electron-transport layer 114 preferably has an electron mobility of greater than or equal to $1 \times 10^{-6}$ $cm^2/Vs$. Specific examples of substances having a high electron-transport property include a metal complex having a quinoline skeleton, a metal complex having a benzoquinoline skeleton, a metal complex having an oxazole-based ligand, and a metal complex having a thiazole-based ligand. Specific examples of metal complexes having a quinoline skeleton include tris(8-quinolinolato)aluminum (abbreviation: $Alq_3$), tris(4-methyl-8-quinolinolato)aluminum (abbreviation: $Almq_3$), and bis(2-methyl-8-quinolinolato)(4-phenylphenolato)aluminum (abbreviation: BAlq). A specific example of a metal complex having a benzoquinoline skeleton is bis(10-hydroxybenzo[h]quinolinato)beryllium (abbreviation: $BeBq_2$). A specific example of a metal complex having an oxazole-based ligand is bis[2-(2-hydroxyphenyl)benzoxazolato]zinc (abbreviation: $Zn(BOX)_2$). A specific example of a metal complex having a thiazole-based ligand is bis[2-(2-hydroxyphenyl)benzothiazolato]zinc (abbreviation: $Zn(BTZ)_2$). Other than the metal complexes, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ 01), bathophenanthroline (abbreviation: BPhen), bathocuproine (abbreviation: BCP), or the like can be used. The substances specifically listed above are mainly substances having an electron mobility of more than or equal to $10^{-6}$ $cm^2/Vs$. Note that any substance other than the above substances may be used for the electron-transport layer 114 as long as the electron-transport property is higher than the hole-transport property. Further, the electron-transport layer 114 may have a single-layer structure or a stacked-layer structure.

Further, a layer for controlling transport of electron carriers may be provided between the light-emitting layer 113 and the electron-transport layer 114. Note that the layer for controlling transport of electron carriers is a layer obtained by adding a small amount of substance having a high electron-trapping property to the above-described material having a high electron-transport property. By providing the layer for controlling transport of electron carriers, it is possible to suppress transfer of electron carriers, and to adjust carrier balance. Such a structure is very effective in suppressing a problem (such as shortening of element lifetime) caused when electrons pass through the light-emitting layer.

In addition, an electron-injection layer may be provided between the electron-transport layer 114 and the second electrode 104, in contact with the second electrode 104. As the electron-injection layer, a layer which contains a substance having an electron-transport property and an alkali metal, an alkaline earth metal, or a compound thereof such as lithium fluoride (LiF), cesium fluoride (CsF), or calcium fluoride ($CaF_2$) may be used. Specifically, a layer containing $Alq_3$ and magnesium (Mg) can be used. By providing the electron-injection layer, electrons can be injected efficiently from the second electrode 104.

Various methods can be used for forming the organic EL layer 103 regardless of a thy method or a wet method. For example, a vacuum evaporation method, an inkjet method, or a spin-coating method can be used. In the case where the organic EL layer 103 has a stacked-layer structure, deposition methods of the layers may be different or the same.

Further, the first electrode 102 and the second electrode 104 may be formed by a wet process using a sol-gel method, or a wet method using a liquid metal material. Further, the first electrode 102 and the second electrode 104 may be formed by a thy process such as a sputtering method or a vacuum evaporation method. By a combination of the light-emitting element and the glass sealed body according to one embodiment of the present invention, a light-emitting device which has a longer lifetime and is strong against external force such as impact, distortion, or the like can be obtained.

The methods and structures described in this embodiment can be combined as appropriate with any of the methods and structures described in the other embodiments.

Embodiment 7

In this embodiment, a light-emitting element in which a plurality of light-emitting units are stacked (this light-emitting element is hereinafter referred to as "tandem light-emitting element") will be described as one embodiment of the present invention with reference to FIG. 10B. The tandem light-emitting element is a light-emitting element having a plurality of light-emitting units between a first electrode and a second electrode. The light-emitting units can be similar to the above-described organic EL layer 103.

Figure 10B:
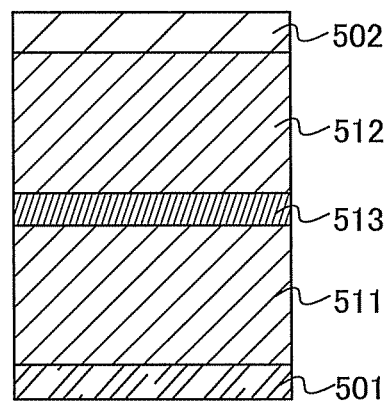

In FIG. 10B, a first light-emitting unit 511 and a second light-emitting unit 512 are stacked between the first electrode 501 and the second electrode 502. Electrodes similar to those described in Embodiment 6 can be used as the first electrode 501 and the second electrode 502. Further, the structures of the first light-emitting unit 511 and the second light-emitting unit 512 may be the same or different from each other, and each of the structures can be similar to the structure described in Embodiment 6.

A charge generation layer 513 is provided between the first light-emitting unit 511 and the second light-emitting unit 512. The charge generation layer 513 contains a composite material of an organic compound and a metal oxide and has a function of injecting electrons to one side of the light-emitting unit, and holes to the other side of the light-emitting unit, when voltage is applied between the first electrode 501 and the second electrode 502. The composite material of the organic compound and the metal oxide enables low-voltage driving and low-current driving because of its superior carrier-injection property and carrier-transport property.

It is preferable to use an organic compound which has a hole-transport property and has a hole mobility of greater than or equal to $10^{-6}$ cm$^2$/Vs as the organic compound. Specific examples of the organic compound include an aromatic amine compound, a carbazole compound, aromatic hydrocarbon, a high molecular compound (e.g., an oligomer, a dendrimer, and a polymer), or the like. An oxide of a metal belonging to any of Groups 4 to 8 in the periodic table is preferable as the metal oxide mixed with the organic compound; specifically, vanadium oxide, niobium oxide, tantalum oxide, chromium oxide, molybdenum oxide, tungsten oxide, manganese oxide, and rhenium oxide are preferable because of their high electron-accepting properties. In particular, molybdenum oxide is preferable because it is stable in the air, has a low hygroscopic property, and is easily handled.

The charge generation layer 513 may have a single-layer structure or a stacked-layer structure. For example, the charge generation layer 513 may have a structure in which a layer containing a composite material of an organic compound and a metal oxide and a layer containing one compound selected from electron-donating substances and a compound having a high electron-transport property are stacked; or a structure in which a layer containing a composite material of an organic compound and a metal oxide and a transparent conductive film are stacked.

In this embodiment, the light-emitting element having two light-emitting units is described; however, the present invention is not limited to this structure. That is, a tandem light-emitting element may be a light-emitting element having three or more light-emitting units. In that case also, a charge generation layer is provided between the light-emitting units. For example, it is also possible to form a light-emitting element having a first unit, a second unit formed using a first light-emitting material which emits light with a longer wavelength than the first unit (e.g., red light), and a third unit formed using a second light-emitting material which emits light with a longer wavelength than the first unit and a shorter wavelength than the first light-emitting material (e.g., green light). By using these light-emitting units, a white light-emitting device can be realized.

A plurality of light-emitting units which are partitioned by a charge generation layer are arranged between a pair of electrodes in the tandem light-emitting element according to this embodiment, whereby the tandem light-emitting element can emit light with high luminance while the current density is kept low. Since the current density can be low, the light-emitting element can have high luminance and a long lifetime. By a combination of the light-emitting element and the glass sealed body according to one embodiment of the present invention, a light-emitting device which has a longer lifetime and is strong against external force such as impact, distortion, or the like, can be obtained.

The methods and structures described in this embodiment can be combined as appropriate with any of the methods and structures described in the other embodiments.

Embodiment 8

In this embodiment, a passive matrix light-emitting device and an active matrix light-emitting device each of which is sealed with a glass sealed body according to one embodiment of the present invention will be described.

FIGS. 11A to 11D and FIG. 12 illustrate examples of passive-matrix light-emitting devices.

In a passive-matrix (also called simple-matrix) light-emitting device, a plurality of anodes arranged in stripes (in stripe form) are provided to be perpendicular to a plurality of cathodes arranged in stripes. At their intersections, a light-emitting layer is interposed. Therefore, a pixel at an intersection of an anode selected (to which a voltage is applied) and a cathode selected emits light.

Figure 11A:
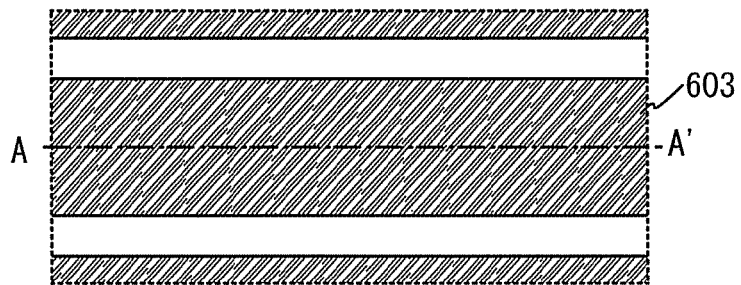
FIGS. 11A to 11D illustrate an example of a light-emitting device according to one embodiment of the present invention.
Figure 11B:
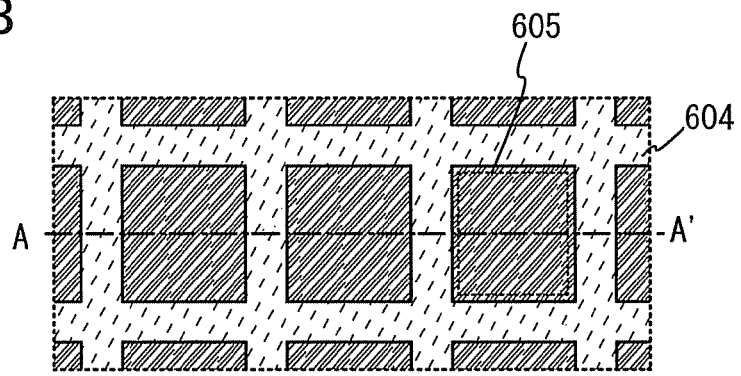
Figure 11C:
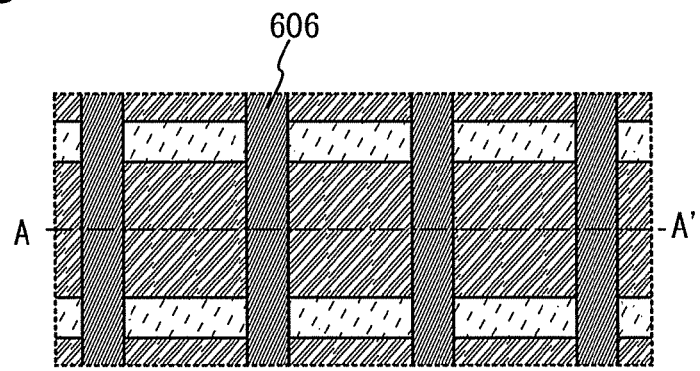
Figure 11D:
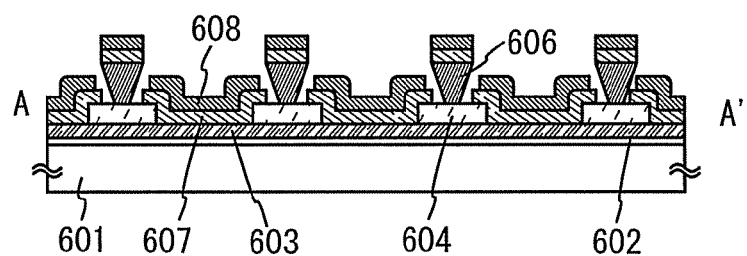

FIGS. 11A to 11C are plan views of a pixel portion before sealing, and FIG. 11D is a cross-sectional view taken along chain line A-A' in FIGS. 11A to 11C.

Over a glass substrate 601, an insulating layer 602 is formed as a base insulating layer. Note that the insulating layer 602 may be omitted when unnecessary. Over the insulating layer 602, a plurality of first electrodes 603 are arranged in stripes at regular intervals (see FIG. 11A). Note that each of the first electrodes 603 in this embodiment corresponds to the first electrode 102 in Embodiment 6.

In addition, a partition 604 having openings 605 each corresponding to a pixel is provided over the first electrodes 603. The partition 604 is formed using an insulating material. For example, polyimide, acrylic, polyamide, polyimide amide, a resist, a photosensitive or non-photosensitive organic material such as benzocyclobutene, or an SOG film such as an $SiO_x$ film that contains an alkyl group can be used as the insulating material. Note that the openings 605 each corresponding to a pixel serve as light-emitting regions (see FIG. 11B).

Over the partition 604 having the openings 605, a plurality of partitions 606 are provided to intersect with the first electrodes 603 (see FIG. 11C). The plurality of partitions 606 is formed in parallel to each other, and inversely tapered.

Over each of the first electrodes 603 and the partition 604, an organic EL layer 607 and a second electrode 608 are sequentially stacked (see FIG. 11D). Note that the organic EL layer 607 in this embodiment corresponds to the organic EL layer 103 in Embodiment 6, and the second electrode 608 in this embodiment corresponds to the second electrode 104 in Embodiment 6. The total height of the partition 604 and the partition 606 is larger than the total thickness of the organic EL layer 607 and the second electrode 608; therefore, the organic EL layer 607 and the second electrode 608 are divided into a plurality of regions as illustrated in FIG. 11D. Note that the plurality of divided regions are electrically isolated from one another.

The second electrode 608 is formed in stripes to intersect with the first electrode 603. Note that when the organic EL layer 607 and the second electrode 608 are formed, layers similar thereto are also formed over the inversely-tapered partitions 606; however, the layers are separated from the organic EL layer 607 and the second electrode 608.

Next, based on the glass substrate 601, a glass sealed body is formed as described in Embodiment 2. Thereby, deterioration of the light-emitting element can be significantly suppressed. Note that the sealed space may be filled with a dry filler or a dry inert gas. In addition, a desiccant or the like may be put in the glass sealed body so that deterioration of the light-emitting element due to moisture or the like can be prevented. The desiccant removes a minute amount of moisture, thereby achieving sufficient desiccation. As the desiccant, oxide of an alkaline earth metal such as calcium oxide or barium oxide, zeolite, silicagel, or the like can be used. Oxide of an alkaline earth metal adsorbs moisture by chemical adsorption, and zeolite and silicagel adsorb moisture by physical adsorption.

Figure 12:
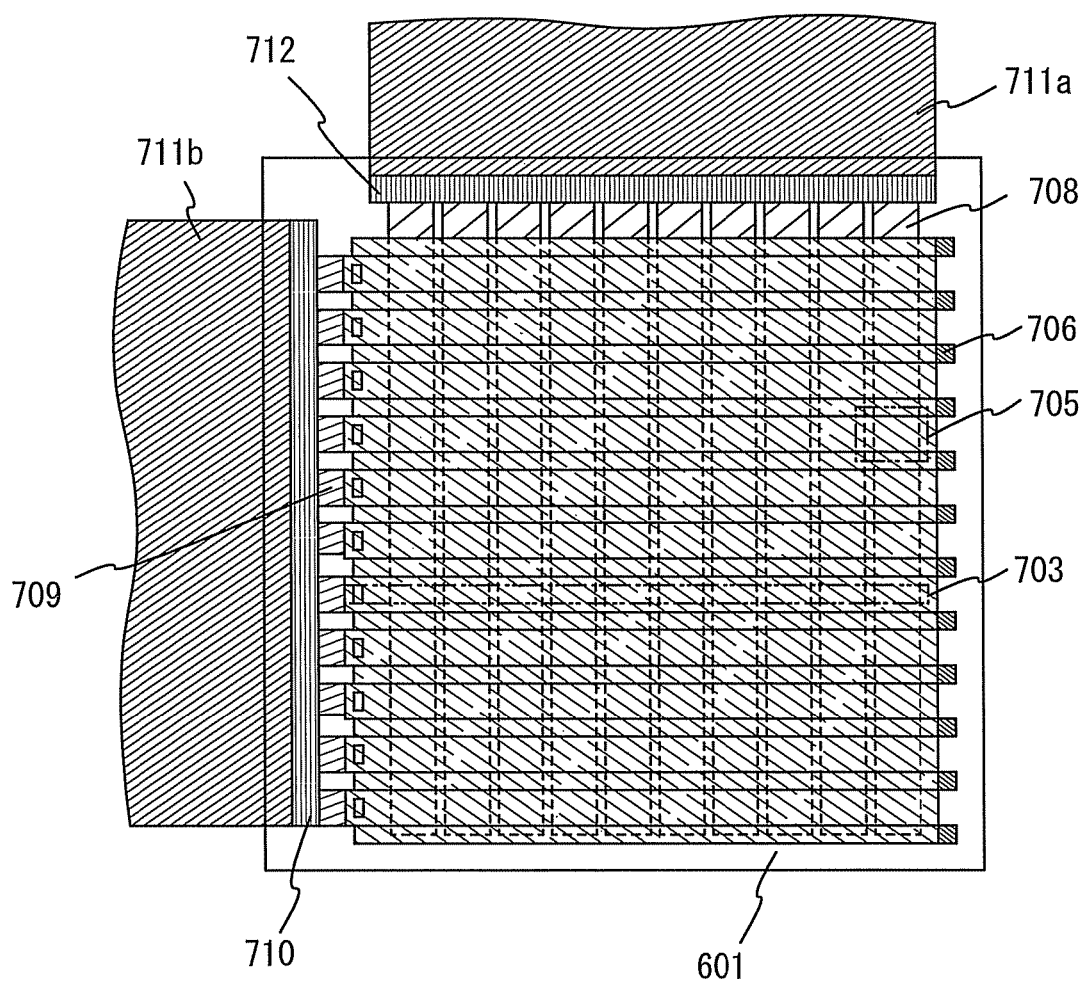
FIG. 12 illustrates an example of a light-emitting device according to one embodiment of the present invention.

FIG. 12 is a plan view of the passive-matrix light-emitting device illustrated in FIGS. 11A to 11D that is provided with a flexible printed circuit (FPC) or the like.

In FIG. 12, scan lines and data lines perpendicularly intersect with each other in a pixel portion for displaying images.

The first electrode 603, the second electrode 608, and the inversely-tapered partition 606 in FIGS. 11A to 11D respectively correspond to a scan line 703, a data line 708, and a partition 706 in FIG. 12. The EL layers 607 illustrated in FIG. 11D are interposed between the data lines 708 and the scanning lines 703, and an intersection indicated by a region 705 corresponds to one pixel.

The scan lines 703 are electrically connected at their ends to connection wirings 709, and the connection wirings 709 are connected to an FPC 711b via an input terminal 710. In addition, the data lines 708 are connected to an FPC 711a via an input terminal 712. The data line 708 and the connection wiring 709 respectively correspond to the terminals 126a and 126b in FIGS. 5A to 5C. A partition of a frit glass is formed so as to cross the data lines 708 and the connection wirings 709, and a glass sealed body is formed by the method described in the above embodiment, for example.

An optical film such as a polarizing plate, a circularly polarizing plate (including an elliptically polarizing plate), a retardation plate (a quarter-wave plate or a half-wave plate), or a color filter may be provided on a light-emitting surface as needed. Further, in addition to the polarizing plate or the circularly polarizing plate, an anti-reflection film may be provided so that reflection of external light can be suppressed. Alternatively, projections and/or depressions may be provided on the light-emitting surface by which reflected light is diffused, whereby reflection of external light to the light-emitting surface can be suppressed.

Although FIG. 12 illustrates an example in which a driver circuit is not provided over the substrate, the present invention is not particularly limited to this example. An IC chip including a driver circuit may be mounted on the substrate.

When the IC chip is mounted, a data line side IC and a scanning line side IC, in each of which the driver circuit for transmitting a signal to a pixel portion is formed, are mounted on the periphery of (outside) the pixel portion. As a method for mounting an IC chip, a COG method, TCP, a wire bonding method, or the like can be used. The TCP is a TAB tape mounted with the IC, and the TAB tape is connected to a wiring over an element formation substrate to mount the IC. The data line side IC and the scan line side IC may be formed using a silicon substrate or a silicon on insulator (SOI) substrate, or may be formed over a glass substrate, a quartz substrate, or a plastic substrate.

Figure 13A:
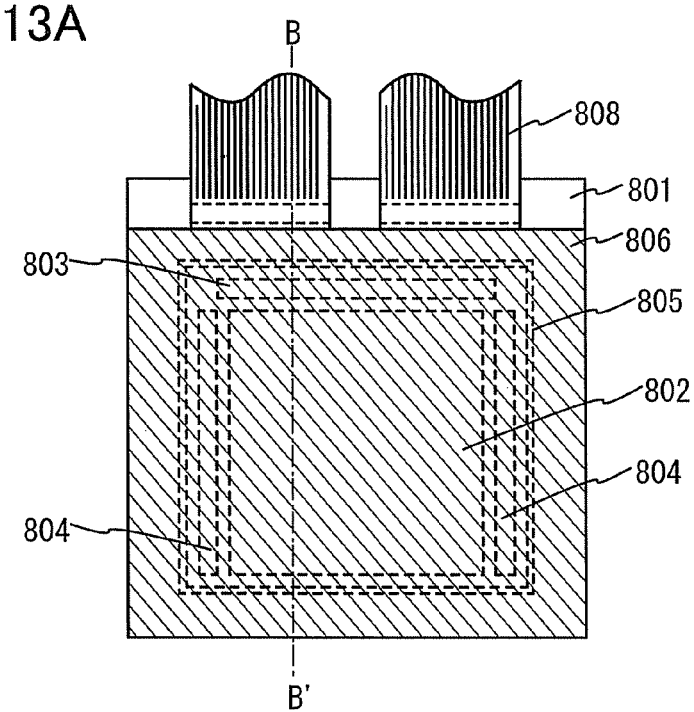
FIGS. 13A and 13B illustrate an example of a light-emitting device according to one embodiment of the present invention.
Figure 13B:
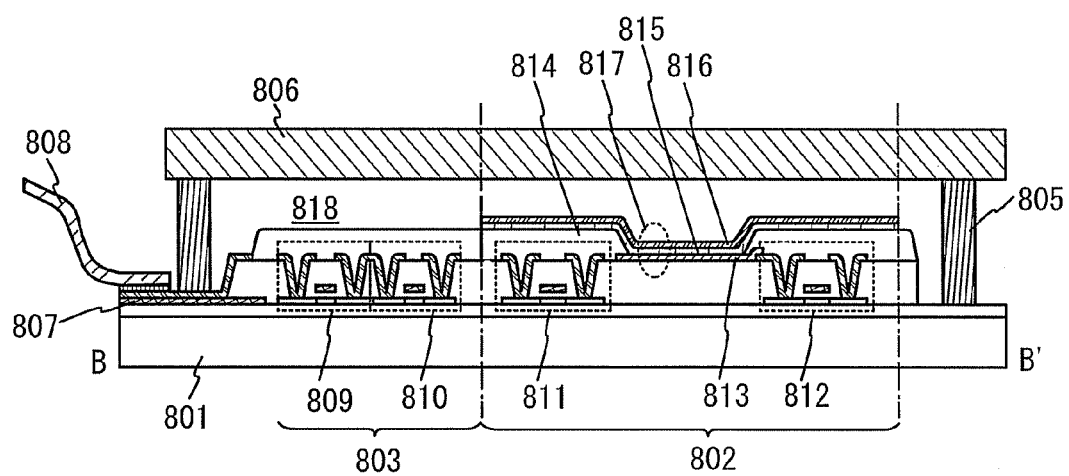

Next, an example of an active matrix light-emitting device will be described with reference to FIGS. 13A and 13B. Note that FIG. 13A is a plan view of a light-emitting device and FIG. 13B is a cross-sectional view taken along chain line B-B' in FIG. 13A. The active-matrix light-emitting device of this embodiment includes a pixel portion 802 provided over a glass substrate 801, a driver circuit portion (source-side driver circuit) 803, and a driver circuit portion (gate-side driver circuit) 804. The pixel portion 802, the driver circuit portion 803, and the driver circuit portion 804 are sealed in a glass sealed body formed by a partition 805, the glass substrate 801, and a glass substrate 806.

Over the glass substrate 801, a lead wiring 807 for connecting an external input terminal through which a signal (e.g., a video signal, a clock signal, a start signal, a reset signal, or the like) or a potential from the outside is transmitted to the driver circuit portion 803 and the driver circuit portion 804 is provided. Here, an example is described in which a FPC 808 is provided as the external input terminal. Note that although only an FPC is illustrated here, a printed wiring board (PWB) may be attached thereto. In this specification, the light-emitting device includes in its category the light-emitting device itself and the light-emitting device on which the FPC or the PWB is mounted.

Next, a cross-sectional structure of the active-matrix light-emitting device will be described with reference to FIG. 13B. Although the driver circuit portion 803, the driver circuit portion 804, and the pixel portion 802 are formed over the glass substrate 801, the pixel portion 802 and the driver circuit portion 803 which is the source, side driver circuit are illustrated in FIG. 13B.

An example is illustrated in which the driver circuit portion 803 includes a CMOS circuit which is a combination of an n-channel TFT 809 and a p-channel TFT 810. Note that the driver circuit portion can be foamed using various types of circuits such as a CMOS circuit, a PMOS circuit, or an NMOS circuit. In this embodiment, a driver-integrated type in which the pixel portion and a driver circuit are funned over the same substrate is described; however, the present invention is not limited to this structure, and a driver circuit can be formed over a substrate that is different from the substrate over which a pixel portion is formed.

The pixel portion 802 has a plurality of pixels, each including a switching TFT 811, a current-controlling TFT 812, and an anode 813 electrically connected to a wiring (a source electrode or a drain electrode) of the current-controlling TFT 812. An insulator 814 is formed so as to cover an end portion of the anode 813. In this embodiment, the insulator 814 is formed using a positive photosensitive acrylic resin. Note that there is no particular limitation on structures of the TFTs such as the switching TFT 811 and the current-controlling TFT 812. For example, a staggered TFT or an inverted-staggered TFT may be used. A top-gate TFT or a bottom-gate TFT may also be used. There is no particular limitation also on materials of a semiconductor used for the TFTs, and silicon or an oxide semiconductor such as oxide containing indium, gallium, and zinc may be used. In addition, crystallinity of a semiconductor used for the TFT is not particularly limited either; an amorphous semiconductor or a crystalline semiconductor may be used.

A light-emitting element 817 includes an anode 813, an organic EL layer 815, and a cathode 816. The structure, the material, and the like of the light-emitting element are as described above. Note that the anode 813, the organic EL layer 815, and the cathode 816 in FIGS. 13A and 13B correspond to the first electrode 102, the organic EL layer 103, and the second electrode 104 in Embodiment 6, respectively. Although not illustrated, the cathode 816 is electrically connected to the FPC 808 which is an external input terminal.

The insulator 814 is provided at an end portion of the anode 813. Further, in order that the cathode 816 formed over the insulator 814 favorably covers the insulator 814, a corner portion of the insulator 814 is preferably rounded. For example, it is preferable that the corner portion of the insulator 814 have a curved surface with a radius of curvature of 0.2 µm to 3 µm. The insulator 814 can be formed using an organic compound such as a negative photosensitive resin which becomes insoluble in an etchant by light or a positive photosensitive resin which becomes soluble in an etchant by light, or an inorganic compound such as silicon oxide or silicon oxynitride can be used.

Although the cross-sectional view of FIG. 13B illustrates only one light-emitting element 817, a plurality of light-emitting elements is arranged in matrix in the pixel portion 802. For example, light-emitting elements that emit light of three kinds of colors (R, G, and B) are formed in the pixel portion 802, so that a light-emitting device capable of full color display can be obtained. Alternatively, a light-emitting device capable of full color display may be obtained by a combination of the white light-emitting element described in the above embodiment and a color filter. Further, the light-emitting element can have any of a bottom emission structure, a top emission structure, and a dual emission structure.

The light-emitting element 817 is provided in a glass sealed body 818 that is surrounded by the glass substrate 801, the glass substrate 806, and the partition 805. The glass sealed body 818 may be filled with a rare gas, a nitrogen gas, or a solid.

As described above, the active matrix light-emitting device which is sealed with the glass sealed body according to one embodiment of the present invention can be obtained. The active matrix light-emitting device has a longer lifetime and is strong against external force such as impact, distortion, or the like.

The methods and structures described in this embodiment can be combined as appropriate with any of the methods and structures described in the other embodiments.

Embodiment 9

In this embodiment, specific examples of electronic devices each of which is manufactured using the light-emitting device described in the above embodiments and of the light-emitting devices each of which is used as a lighting device will be described with reference to FIGS. 14A to 14E and FIG. 15.

Examples of electronic devices that can be applied to the present invention include a television set (also referred to as a television or a television receiver), a monitor of a computer, a digital camera, a digital video camera, a digital photo frame, a mobile phone, a portable game machine, a portable information terminal, an audio reproducing device, a game machine (e.g., a pachinko machine or a slot machine), a housing of a game machine, and the like. Some specific examples of these electronic devices and lighting devices are illustrated in FIGS. 14A to 14E and FIG. 15.

FIG. 14A illustrates a television set 9100. In the television set 9100, a display portion 9103 is incorporated in a housing 9101. A light-emitting device manufactured using one embodiment of the present invention can be used in the display portion 9103, so that an image can be displayed on the display portion 9103. Note that the housing 9101 is supported by a stand 9105 here.

The television set 9100 can be operated with an operation switch of the housing 9101 or a separate remote controller 9110. Channels and volume can be controlled with an operation key 9109 of the remote controller 9110 so that an image displayed on the display portion 9103 can be controlled. Furthermore, the remote controller 9110 may be provided with a display portion 9107 for displaying data output from the remote controller 9110.

The television set 9100 illustrated in FIG. 14A is provided with a receiver, a modem, and the like. With the receiver, the television set 9100 can receive a general television broadcast. Further, when the television set 9100 is connected to a communication network by wired or wireless connection via the modem, one-way (from a transmitter to a receiver) or two-way (between a transmitter and a receiver or between receivers) data communication can be performed.

The light-emitting device which is sealed with the glass sealed body, which is described in the above embodiments, is employed, whereby the light-emitting element is less likely to deteriorate; therefore, by using the light-emitting device for the display portion 9103 of the television set, the television set can have higher durability and a longer lifetime than a conventional television set.

FIG. 14B illustrates a computer which includes a main body 9201, a housing 9202, a display portion 9203, a keyboard 9204, an external connection port 9205, a pointing device 9206, and the like. The computer is manufactured using a light-emitting device manufactured using one embodiment of the present invention for the display portion 9203.

Further, the light-emitting device which is sealed with the glass sealed body, which is described in the above embodiments, is employed, whereby the light-emitting element is less likely to deteriorate; therefore, by using the light-emitting device for the display portion 9203 of the computer, the display portion can have higher durability and a longer lifetime than a conventional display portion.

FIG. 14C illustrates a portable game machine including two housings, a housing 9301 and a housing 9302 which are jointed with a connector 9303 so as to be opened and closed. A display portion 9304 is incorporated in the housing 9301, and a display portion 9305 is incorporated in the housing 9302. In addition, the portable game machine illustrated in FIG. 14C includes an input means such as operation keys 9309, a connection terminal 9310, a sensor 9311 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9312. The portable game machine may further be provided with a speaker portion 9306, a recording medium insertion portion 9307, an LED lamp 9308, and the like. Needless to say, the structure of the portable game machine is not limited to the above, and it is acceptable as long as the light-emitting device manufactured using any of the above embodiments is used for one or both of the display portion 9304 and the display portion 9305.

The portable game machine illustrated in FIG. 14C has a function of reading a program or data stored in a recording medium to display it on the display portion, and a function of sharing information with another portable game machine by wireless communication. Note that a function of the portable game machine illustrated in FIG. 14C is not limited to the above, and the portable game machine can have a variety of functions.

Further, the light-emitting device which is sealed with the glass sealed body, which is described in the above embodiments, is employed, whereby the light-emitting element is less likely to deteriorate; therefore, by using the light-emitting device for the display portions 9304 and 9305 of the portable game machine, the portable game machine can have higher durability and a longer lifetime than a conventional portable game machine.

FIG. 14D illustrates a tabletop lighting device including a lighting portion 9401, a shade 9402, an adjustable arm 9403, a support 9404, a base 9405, and a power supply switch 9406. The tabletop lighting device is manufactured using a light-emitting device manufactured using one embodiment of the present invention for the lighting portion 9401. Note that the modes of the lighting device is not limited to tabletop lighting devices, but include ceiling-fixed lighting devices, wall-hanging lighting devices, portable lighting devices, and the like.

FIG. 14E illustrates an example of a mobile phone. A mobile phone 9500 is provided with a display portion 9502 incorporated in a housing 9501, an operation button 9503, an external connection port 9504, a speaker 9505, a microphone 9506, and the like. Note that the mobile phone 9500 is manufactured using a light-emitting device manufactured using one embodiment of the present invention for the display portion 9502.

Users can input data, make a call, or text a message by touching the display portion 9502 of the mobile phone 9500 illustrated in FIG. 14E with their fingers or the like.

There are mainly three screen modes for the display portion 9502. The first mode is a display mode mainly for displaying images. The second mode is an input mode mainly for inputting data such as text. The third mode is a display-and-input mode in which two modes of the display mode and the input mode are combined.

For example, in the case of making a call or text messaging, an input mode mainly for inputting text is selected for the display portion 9502 so that characters displayed on a screen can be input. In this case, it is preferable to display a keyboard or number buttons on almost the entire screen of the display portion 9502.

By providing a detection device which includes a sensor for detecting inclination, such as a gyroscope or an acceleration sensor, inside the mobile phone 9500, the direction of the mobile phone 9500 (whether the mobile phone 9500 is placed horizontally or vertically for a landscape mode or a portrait mode) is determined so that display on the screen of the display portion 9502 can be automatically switched.

In addition, the screen modes are switched by touching the display portion 9502 or operating the operation button 9503 of the housing 9501. Alternatively, the screen modes can be switched depending on kinds of images displayed in the display portion 9502. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 9502 is not performed within a specified period of time while a signal detected by an optical sensor in the display portion 9502 is detected, the screen mode may be controlled so as to be switched from the input mode to the display mode.

The display portion 9502 can also function as an image sensor. For example, an image of a palm print, a fingerprint, or the like is taken by touching the display portion 9502 with the palm or the finger, whereby personal authentication can be performed. Further, by providing a backlight or a sensing light source which emits a near-infrared light in the display portion, an image of a finger vein, a palm vein, or the like can be taken.

Further, the light-emitting device which is sealed with the glass sealed body, which is described in the above embodiments, is employed, whereby the light-emitting element is less likely to deteriorate; therefore, by using the light-emitting device for the display portion 9502 of the mobile phone, the mobile phone can have higher durability and a longer lifetime than a conventional mobile phone.

Figure 15:
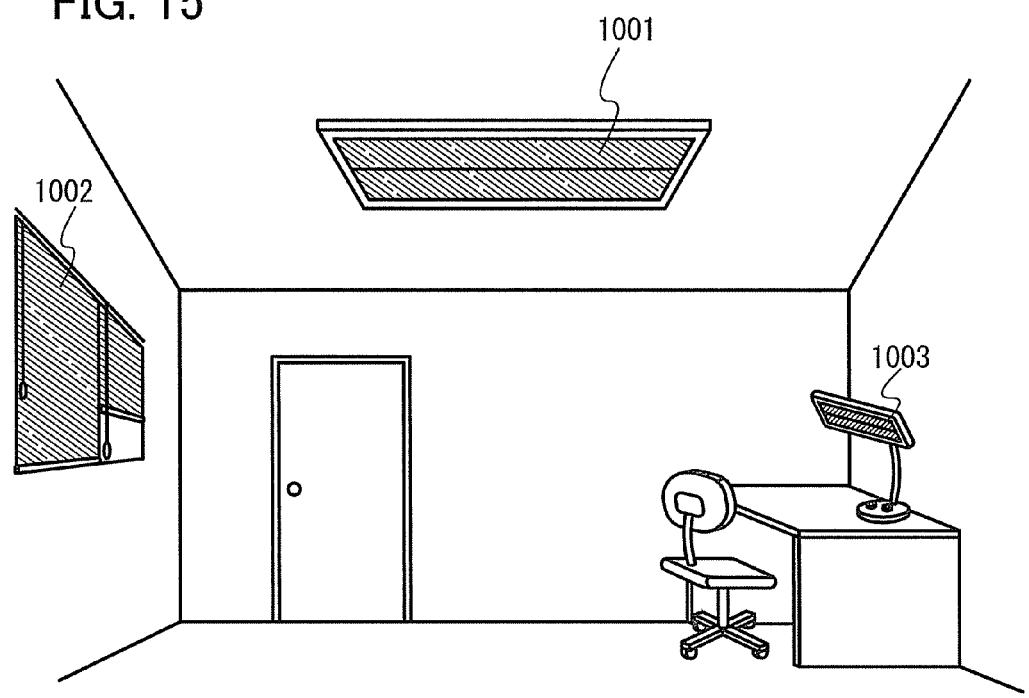
FIG. 15 illustrates examples of lighting devices according to one embodiment of the present invention.

FIG. 15 illustrates an example in which the light-emitting device manufactured using one embodiment of the present invention is used for an indoor lighting device 1001. Since the light-emitting device manufactured using one embodiment of the present invention can have a large area, the light-emitting device can be used as a lighting device having a large area. In addition, the light-emitting device described in the above embodiments can be thinned and thus can be used as a roll-up type lighting device 1002. In order to manufacture such a device, for example, an extra-thin glass substrate capable of being rolled up may be used as part of a glass sealed body. Even an extra-thin glass substrate capable of being rolled up is preferably applied to the present invention, because it does not easily transmit moisture, oxygen, or the like. As illustrated in FIG. 15, a tabletop lighting device 1003 illustrated in FIG. 14D may be used in a room provided with the indoor lighting device 1001.

The light-emitting device which is sealed with the glass sealed body, which is described in the above embodiments, is employed, whereby the light-emitting element is less likely to deteriorate; therefore, by using the light-emitting device for the lighting device, the lighting device can have higher durability and a longer lifetime than a conventional lighting device.

Figure 16:
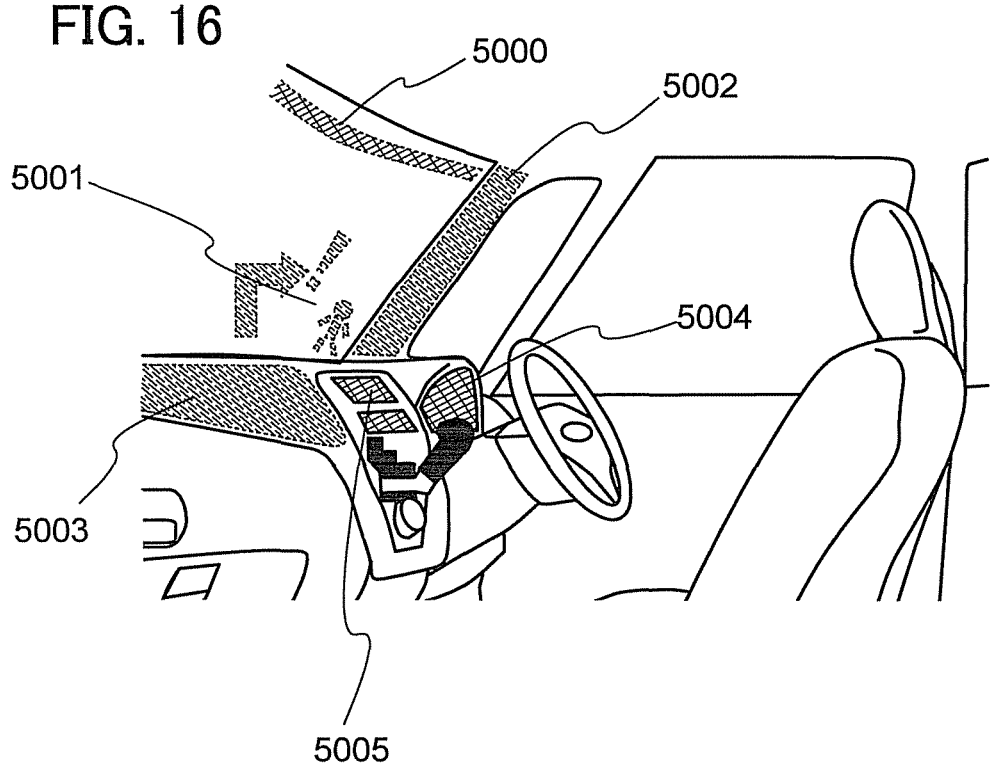
FIG. 16 illustrates examples of in-vehicle display devices according to one embodiment of the present invention.

FIG. 16 illustrates one embodiment in which the light-emitting device which is sealed with the glass sealed body according to one embodiment of the present invention is used for an automobile windshield and an automobile dashboard.

Each of the display device 5000 and the display device 5001 is the light-emitting device which is provided for the automobile windshield and which is sealed with the glass sealed body according to one embodiment of the present invention. The light-emitting element described in Embodiment 6 or 7 can be formed into so-called see-through display device, through which the opposite side can be seen, by including electrodes having a light-transmitting property as a first electrode and a second electrode. Such a see-through display device can be provided even in the automobile windshield, without hindering the vision. In addition, for example, when a transistor for driving the light-emitting element is provided, a transistor having a light-transmitting property, such as an organic transistor using an organic semiconductor material or a transistor using an oxide semiconductor, is preferably used.

The display device 5002 is a display device which is provided in a pillar portion and which incorporates the light-emitting element described in Embodiment 6 or Embodiment 7. The display device 5002 can compensate for the view hindered by the pillar portion by showing an image taken by an imaging unit provided in the automobile body. Similarly, the display device 5003 provided in the dashboard can compensate for the view hindered by the automobile body by showing an image taken by an imaging unit provided in the outside of the automobile body, which leads to elimination of blind areas and enhancement of safety. Showing an image so as to compensate for the area which a driver cannot see, makes it possible for the driver to confirm safety easily and comfortably.

The display device 5004 and the display device 5005 can provide a variety of kinds of information such as information of navigation, speedometer, tachometer, mileage, fuel meter, gearshift indicator, and air condition. The content or layout of the display can be changed freely by a user as appropriate. Further, such information can be shown in the display devices 5000 to 5003. Note that the display devices 5000 to 5005 can also be used as lighting devices.

The light-emitting device which is sealed with the glass sealed body according to one embodiment of the present invention has a long lifetime and is extremely strong against external force such as impact, distortion, or the like; therefore, the light-emitting device is suitable for being mounted in a vehicle.

The methods and structures described in this embodiment can be combined as appropriate with any of the methods and structures described in the other embodiments.

Embodiment 10

Figure 17A:
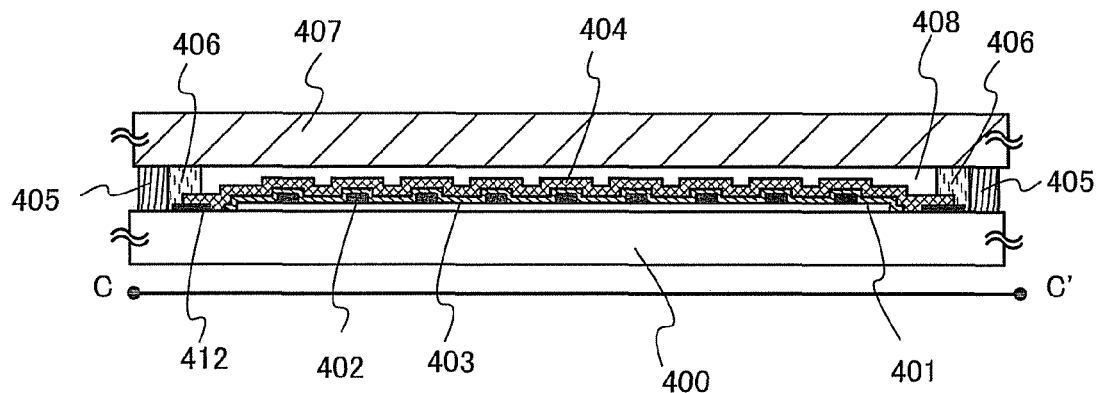
FIGS. 17A and 17B illustrate an example of a lighting device according to one embodiment of the present invention.
Figure 17B:
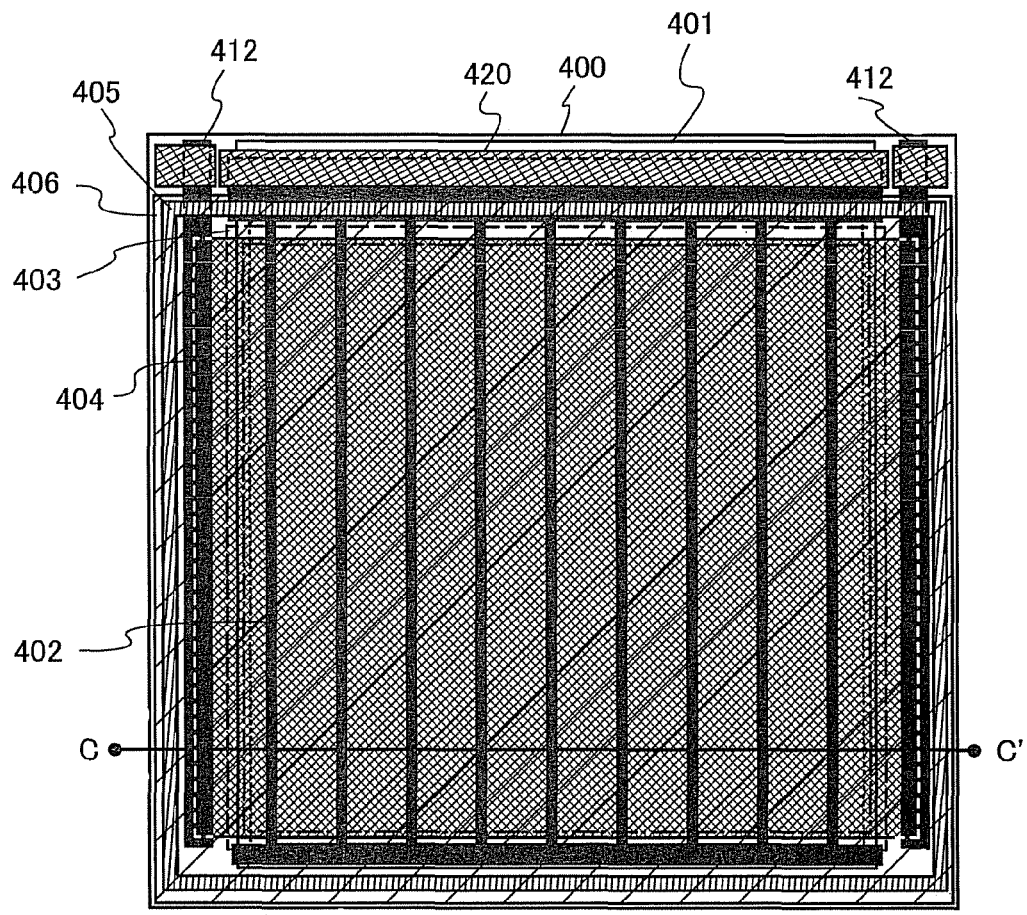

In this embodiment, an example in which the light-emitting device which is sealed with the glass sealed body according to one embodiment of the present invention is used as a lighting device will be described with reference to FIGS. 17A and 17B. Note that FIG. 17B is a plan view of a lighting device and FIG. 17A is a cross-sectional view taken along line C-C' in FIG. 17B.

In the lighting device in this embodiment, a first electrode 401 is formed over a glass substrate 400 which is a support and has a light-transmitting property. The glass substrate 400 and the first electrode 401 correspond to the glass substrate 100 and the first electrode 102 in Embodiment 6, respectively.

An auxiliary wiring 402 is provided over the first electrode 401. Since this embodiment shows an example in which light emission is extracted through the first electrode 401 side, the first electrode 401 is formed using a material having a light-transmitting property. The auxiliary wiring 402 is provided in order to compensate for low conductivity of the material having a light-transmitting property, and has a function of suppressing luminance unevenness in a light emission surface due to voltage drop caused by high resistance of the first electrode 401. The auxiliary wiring 402 is formed using a material whose conductivity is higher than at least that of the material of the first electrode 401. For example, aluminum is preferably used. Note that surfaces of the auxiliary wiring 402 other than a portion thereof in contact with the first electrode 401 are preferably covered with an insulating layer. This is for suppressing light emission over the upper portion of the auxiliary wiring 402, which cannot be extracted, for reducing a reactive current, and for suppressing reduction in power efficiency. Note that a pad 412 for applying voltage to a second electrode 404 may be formed concurrently with the formation of the auxiliary wiring 402.

An organic EL layer 403 is formed over the first electrode 401 and the auxiliary wiring 402. The organic EL layer 403 has a structure corresponding to the structure of the organic EL layer 103 in Embodiment 6 or a structure in which the light-emitting units 511 and 512 and the charge generation layer 513 in Embodiment 7 are combined. Note that the organic EL layer 403 is preferably formed to be slightly larger than the first electrode 401 when seen from above so as to also serve as an insulating layer which prevents a short circuit between the first electrode 401 and the second electrode 404.

The second electrode 404 is formed to cover the organic EL layer 403. The second electrode 404 corresponds to the second electrode 104 in Embodiment 6 and has a similar structure. In this embodiment, it is preferable that the second electrode 404 be formed using a material having high reflectance because light emission is extracted through the first electrode 401 side. In this embodiment, the second electrode 404 is connected to the pad 412, whereby voltage is applied.

In the above manner, the light-emitting element including the first electrode 401, the organic EL layer 403, and the second electrode 404 (and the auxiliary wiring 402) is sealed with the glass sealed body according to one embodiment of the present invention, whereby the lighting device is completed. One of the partitions 405 and 406 each of which is a frit glass described in the above embodiments may be omitted. That is, the glass sealed body is formed by the glass substrate 400, the glass substrate 407, and the partition 405 or/and the partition 406. The glass sealed body is filled with an inert gas 408 or the like, as described in the above embodiment. Alternatively, the glass sealed body may be filled with a solid body which does not discharge moisture, hydrogen, or the like. Further, a desiccant may be included in the inner partition 406, so that moisture can be adsorbed, which results in further improvement in the reliability. Furthermore, when both of the partition 405 and the partition 406 are provided, the partition 406 is protected by the inside of the partition 405; therefore, the partition 406 is no necessarily a frit glass, and may be a functional material having the function of drying or the function of occluding hydrogen, for example.

When parts of the pad 412, the first electrode 401, and the auxiliary wiring 402 are extended to the outside of the partitions 405 and 406, the extended parts can serve as external input terminals. An IC chip 420 mounted with a converter or the like may be provided over the external input terminals.

In the above manner, in the lighting device described in this embodiment, the light-emitting element is sealed with the glass sealed body having a high sealing property; therefore, the lighting device which has a longer lifetime and is strong against external force such as impact, distortion, or the like can be provided.

In the above-described manner, electronic devices and lighting devices can be provided using a lighting device manufactured using one embodiment of the present invention. The scope of application of the light-emitting device manufactured using one embodiment of the present invention is so wide that it can be applied to a variety of fields of electronic devices.

This application is based on Japanese Patent Application serial no. 2011-107804 filed with Japan Patent Office on May 13, 2011, the entire contents of which are hereby incorporated by reference.

What is claimed is:

1. A method for manufacturing a glass sealed body, comprising:
    discharging a paste formed in an annular shape from an outlet which has the annular shape to form a partition which has the annular shape over a first glass substrate, the paste including powdered glass and a binder;
    heating the partition so that the binder is volatilized and the powdered glass is fused to be a frit glass; and
    heating the frit glass and a second glass substrate while disposing in close contact with each other, so that the frit glass and the second glass substrate are welded together to form a closed space by the frit glass, the first glass substrate, and the second glass substrate.

2. The method for manufacturing the glass sealed body according to claim 1, wherein the paste is discharged to form a closed curve.

3. The method for manufacturing the glass sealed body according to claim 1, further comprising a step of forming a frit glass over the second glass substrate.

4. A method for manufacturing a light-emitting device, comprising:
    discharging a paste formed in an annular shape from an outlet which has the annular shape to form a partition which has the annular shape over a first glass substrate, the paste including powdered glass and a binder;
    heating the partition so that the binder is volatilized and the powdered glass is fused to be a fit glass;
    forming a light-emitting element over a second glass substrate; and
    heating the frit glass rapidly while the frit glass and the second glass substrate are disposed in close contact with each other, so that the frit glass and the second glass substrate are welded together to form a closed space by the frit glass, the first glass substrate, and the second glass substrate to seal the light-emitting element in the closed space.

5. The method for manufacturing the light-emitting device according to claim 4,
    wherein a part of a terminal connecting to an electrode of the light-emitting element is led to an outside of the closed space, and
    wherein a depressed portion which engages with a projected portion of the terminal is formed in the frit glass overlapping with the terminal.

6. The method for manufacturing the light-emitting device according to claim 4, wherein the paste is discharged to form a closed curve.

7. The method for manufacturing the light-emitting device according to claim 4, further comprising a step of forming a frit glass over the second glass substrate.

8. The method for manufacturing the light-emitting device according to claim 4, further comprising a step of forming a depressed portion in the partition before heating the partition.

9. A method for manufacturing a light-emitting device, comprising:
    forming a light-emitting element over a first glass substrate;
    discharging a paste formed in an annular shape from an outlet which has the annular shape to form a partition which has the annular shape over the first glass substrate so as to surround the light-emitting element, the paste including powdered glass and a binder;
    heating the partition locally so that the binder is volatilized and the powdered glass is fused to be a frit glass; and
    heating the frit glass locally while the frit glass and a second glass substrate are disposed in close contact with each other, so that the frit glass and the second glass substrate are welded together to form a closed space by the frit glass, the first glass substrate, and the second glass substrate to seal the light-emitting element in the closed space.

10. The method for manufacturing the light-emitting device according to claim 9,
    wherein a part of a terminal connecting to an electrode of the light-emitting element is led to an outside of the closed space, and
    wherein a depressed portion which engages with a projected portion of the terminal is formed in the partition overlapping with the terminal.

11. The method for manufacturing the light-emitting device according to claim 9, wherein a surface of the partition, which is in contact with the second glass substrate, is planarized.

12. The method for manufacturing the light-emitting device according to claim 9, wherein the paste is discharged to form a closed curve.

13. The method for manufacturing the light-emitting device according to claim 9, further comprising a step of forming a frit glass over the second glass substrate.

14. The method for manufacturing the light-emitting device according to claim 9, further comprising a step of forming a depressed portion in the partition before heating the partition.

15. A method for manufacturing a light-emitting device, comprising:
    forming a light-emitting element over a first glass substrate;
    discharging a paste formed in an annular shape from an outlet which has the annular shape to form a partition which has the annular shape over the first glass substrate so as to surround the light-emitting element, the paste including powdered glass and a binder; and
    heating the partition locally while the partition and a second glass substrate are disposed in close contact with each other so that the binder is volatilized and the powdered glass is fused to be a fit glass,
    wherein the fit glass and the second glass substrate are welded together to form a closed space by the frit glass, the first glass substrate, and the second glass substrate to seal the light-emitting element in the closed space.

16. The method for manufacturing the light-emitting device according to claim 15,
    wherein a part of a terminal connecting to an electrode of the light-emitting element is led to an outside of the closed space, and
    wherein a depressed portion which engages with a projected portion of the terminal is formed in the partition overlapping with the terminal.

17. The method for manufacturing the light-emitting device according to claim 15, wherein a surface of the partition, which is in contact with the second glass substrate, is planarized.

18. The method for manufacturing the light-emitting device according to claim 15, wherein the paste is discharged to form a closed curve.

19. The method for manufacturing the light-emitting device according to claim 15, further comprising a step of forming a partition over the second glass substrate.

20. The method for manufacturing the light-emitting device according to claim 15, further comprising a step of forming a depressed portion in the partition before heating the partition.

* * * * *

UNITED STATES PATENT AND TRADEMARK OFFICE
CERTIFICATE OF CORRECTION

PATENT NO. : 8,950,216 B2  
APPLICATION NO. : 13/468607  
DATED : February 10, 2015  
INVENTOR(S) : Koichiro Tanaka Page 1 of 1

It is certified that error appears in the above-identified patent and that said Letters Patent is hereby corrected as shown below:

In the Specification:

Column 1, Line 35; Change "which. EL" to --which EL--.

Column 2, Line 51; Change "form in the" to --form the--.

Column 3, Line 7; Change "the fit glass," to --the frit glass,--.

Column 3, Line 27; Change "the fit glass" to --the frit glass--.

Column 6, Line 13; Change "faun" to --form--.

Column 12, Line 23; Change "cathode: Specifically," to --cathode. Specifically,--.

Column 13, Line 59; Change "PD)," to --TPD),--.

Column 13, Line 61; Change "MIDATA)," to --MTDATA),--.

Column 14, Line 67; Change "thy" to --dry--.

Column 15, Line 9; Change "thy" to --dry--.

Column 18, Line 55; Change "source, side" to --source side--.

Column 18, Line 60; Change "foamed" to --formed--.

Column 18, Line 63; Change "funned" to --formed--.

In the Claims:

Column 25, Line 32, Claim 4; Change "a fit glass;" to --a frit glass;--.

Column 26, Line 45, Claim 15; Change "a fit glass," to --a frit glass,--.

Column 26, Line 46, Claim 15; Change "the fit glass" to --the frit glass--.

Signed and Sealed this  
Fourteenth Day of July, 2015

Michelle K. Lee  
*Director of the United States Patent and Trademark Office*